(12) United States Patent
Zhao et al.

(10) Patent No.: US 11,791,830 B2
(45) Date of Patent: Oct. 17, 2023

(54) ADC APPARATUS AND CONTROL METHOD

(71) Applicant: Halo Microelectronics International, Campbell, CA (US)

(72) Inventors: Lijie Zhao, San Jose, CA (US); Kien Chan Vi, Palo Alto, CA (US); Hai Tao, Sunnyvale, CA (US)

(73) Assignee: Halo Microelectronics International, Campbell, CA (US)

( * ) Notice: Subject to any disclaimer, the term of this patent is extended or adjusted under 35 U.S.C. 154(b) by 0 days.

(21) Appl. No.: 18/062,623

(22) Filed: Dec. 7, 2022

(65) Prior Publication Data
US 2023/0102084 A1 Mar. 30, 2023

Related U.S. Application Data

(63) Continuation-in-part of application No. 17/644,589, filed on Dec. 16, 2021, now Pat. No. 11,722,143.

(60) Provisional application No. 63/143,537, filed on Jan. 29, 2021.

(51) Int. Cl.
*H03M 1/06* (2006.01)
*H03M 1/20* (2006.01)
*H03M 1/46* (2006.01)
*H03M 1/40* (2006.01)

(52) U.S. Cl.
CPC ........ *H03M 1/0607* (2013.01); *H03M 1/201* (2013.01); *H03M 1/40* (2013.01); *H03M 1/46* (2013.01)

(58) Field of Classification Search
CPC ...... H03M 1/0607; H03M 1/201; H03M 1/46; H03M 1/40
USPC .......................... 341/118, 120, 131, 163, 172
See application file for complete search history.

(56) References Cited

U.S. PATENT DOCUMENTS

| 8,378,863 B2* | 2/2013 | Ishikawa | ................. H03M 1/00 341/172 |
| 9,356,615 B1* | 5/2016 | Ranjbar | .............. H03M 1/1023 |
| 10,483,995 B1* | 11/2019 | Lok | ..................... H03M 1/1042 |

* cited by examiner

*Primary Examiner* — Khai M Nguyen
(74) *Attorney, Agent, or Firm* — AP3 Law Firm PLLC

(57) ABSTRACT

An apparatus includes a plurality of binary weighted capacitors coupled between a first input terminal of a comparator and a plurality of signal buses, wherein the plurality of binary weighted capacitors has a binary weight increasing by two times from a first capacitor to an (N−K)th capacitor, and a constant binary weight from the (N−K)th capacitor to a $(N-K-2+2^{(K+1)})$th capacitor, an offset voltage generator configured to generate a digitally controlled offset voltage having $2^{(K+1)}$ steps fed into a second input terminal of the comparator, and a successive approximation logic block configured to receive an output signal of the comparator, and generate an N-bit control signal for controlling the plurality of binary weighted capacitors.

20 Claims, 14 Drawing Sheets

US 11,791,830 B2

ADC APPARATUS AND CONTROL METHOD

PRIORITY

This application is a continuation-in-part of U.S. patent application Ser. No. 17/644,589, filed Dec. 16, 2021, and entitled "ADC Apparatus and Control Method," which is related to, and claims priority to, U.S. Provisional Application No. 63/143,537, filed on Jan. 29, 2021, entitled "ADC Apparatus and Control Method," each application is hereby incorporated herein by reference.

TECHNICAL FIELD

The present invention relates to an analog-to-digital converter (ADC), and, in particular embodiments, to a successive approximation ADC.

BACKGROUND

ADCs are commonly used in electronics systems to convert analog signals into digital signals. The digital signals may be further processed by various digital processors such as digital audio/video processors, wireless communication processors and the like. In some applications, ADCs may be implemented as standalone semiconductor devices. Alternatively, ADCs may be integrated with other circuitry on a single integrated circuit. Among various ADCs, the successive approximation ADC is widely used in a variety of applications requiring good resolution and accuracy.

The successive approximation ADC converts an analog signal to a digital signal by comparing various output values of a digital-to-analog converter (DAC) with the input analog signal over a number of clock cycles. For example, in a first conversion cycle, the most significant bit (MSB) of the digital signal is determined by comparing the input analog signal with the midscale output of the DAC (that is, an analog output corresponding to 100 . . . 00, where the MSB of the DAC is set to logic 1). If the value of the input analog signal is greater than the midscale output of the DAC, the MSB of the digital signal is set to a logical one. On the other hand, if the value of the input analog signal is less than the midscale output of the DAC, the MSB of the digital signal is set to a logical zero. In the second conversion cycle, the input analog signal is compared with the ¼ scale or ¾ scale output of the DAC depending on the outcome of the first conversion cycle. In the second conversion cycle, the second most significant bit is determined. The comparison method described above continues all the way down to the least significant bit (LSB) of the digital signal. Once the LSB has been determined, the analog-to-digital conversion is complete and the digital signal is available at a register of the successive approximation ADC.

A normal resolution successive approximation ADC (e.g., 10-bit resolution) is sufficient for most applications. However, a higher resolution successive approximation ADC (e.g., 11-bit or 12-bit resolution) may be desired in some applications. It is desirable to have a simple and reliable method to increase the resolution of the normal resolution successive approximation ADC so as to satisfy different application demands.

SUMMARY

These and other problems are generally solved or circumvented, and technical advantages are generally achieved, by preferred embodiments of the present disclosure which provide a higher resolution successive approximation ADC through adding a digitally controlled offset voltage into the comparison stage of the successive approximation ADC.

In accordance with an embodiment, a method of converting an analog input signal to a digital output signal comprises adding a digitally controlled offset voltage into a comparison stage of a successive approximation analog-to-digital converter circuit, wherein the digitally controlled offset voltage has a periodic pattern including at least $2^{(K+1)}$ steps, each of which has a value equal to an integer multiplying $2^{(-K)}$ of an analog voltage corresponding to a least significant bit (LSB) of an N-bit digital signal, operating the successive approximation analog-to-digital converter circuit to sequentially generate at least a $2^{(K+1)}$ number of N-bit digital signals based on the at least $2^{(K+1)}$ steps of the digitally controlled offset voltage, summing the at least the $2^{(K+1)}$ number of N-bit digital signals to obtain a summing result, and dividing the summing result through a divider block to obtain a digital signal having (N+K) bits.

In accordance with another embodiment, a converter comprises a comparator configured to receive an output signal of a sample and hold block and an output of a digital-to-analog converter, an offset voltage generator configured to generate a digitally controlled offset voltage added into one input of the comparator, and wherein the digitally controlled offset voltage has a periodic pattern including at least $2^{(K+1)}$ steps, a successive approximation logic block configured to receive an output signal of the comparator, and generate at least a $2^{(K+1)}$ number of N-bit digital signals based on the at least $2^{(K+1)}$ steps of the digitally controlled offset voltage, a summing block configured to receive an output signal of the successive approximation logic block, and a divider block configured to receive a summing result generated by the summing block, wherein the converter is configured to generate a digital signal having (N+K) bits based on the digitally controlled offset voltage having the at least $2^{(K+1)}$ steps.

In accordance with yet another embodiment, a method comprises adding a digitally controlled offset voltage into a comparison stage of a successive approximation analog-to-digital converter circuit, wherein the digitally controlled offset voltage has a periodic pattern including at least $2^{(K+1)}-1$ steps, each of which has a value equal to an integer multiplying $2^{(-K)}$ of an analog voltage corresponding to an LSB (ALSB), wherein the digitally controlled offset voltage is in a ranging from $(2^{(-K)}-1)$ of the ALSB to $(1-2^{(-K)})$ of the ALSB, operating the successive approximation analog-to-digital converter circuit to sequentially generate at least a $2^{(K+1)}-1$ number of N-bit digital signals based on the at least $2^{(K+1)}-1$ steps of the digitally controlled offset voltage, calculating a weighted sum of the $2^{(K+1)}-1$ number of N-bit digital signals to obtain a weighted summing result, wherein an N-bit digital signal corresponding to an output signal of the successive approximation analog-to-digital converter circuit under a zero voltage offset is added twice into the weighted summing result, and dividing the weighted summing result through a divider block to obtain a digital signal having (N+K) bits.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a higher resolution successive approximation ADC. The present disclosure may also be applied, however, to a variety of systems and applications that convert an analog signal into a digital signal. Hereinafter, various embodiments will be explained in detail with reference to the accompanying drawings.

Figure 1:
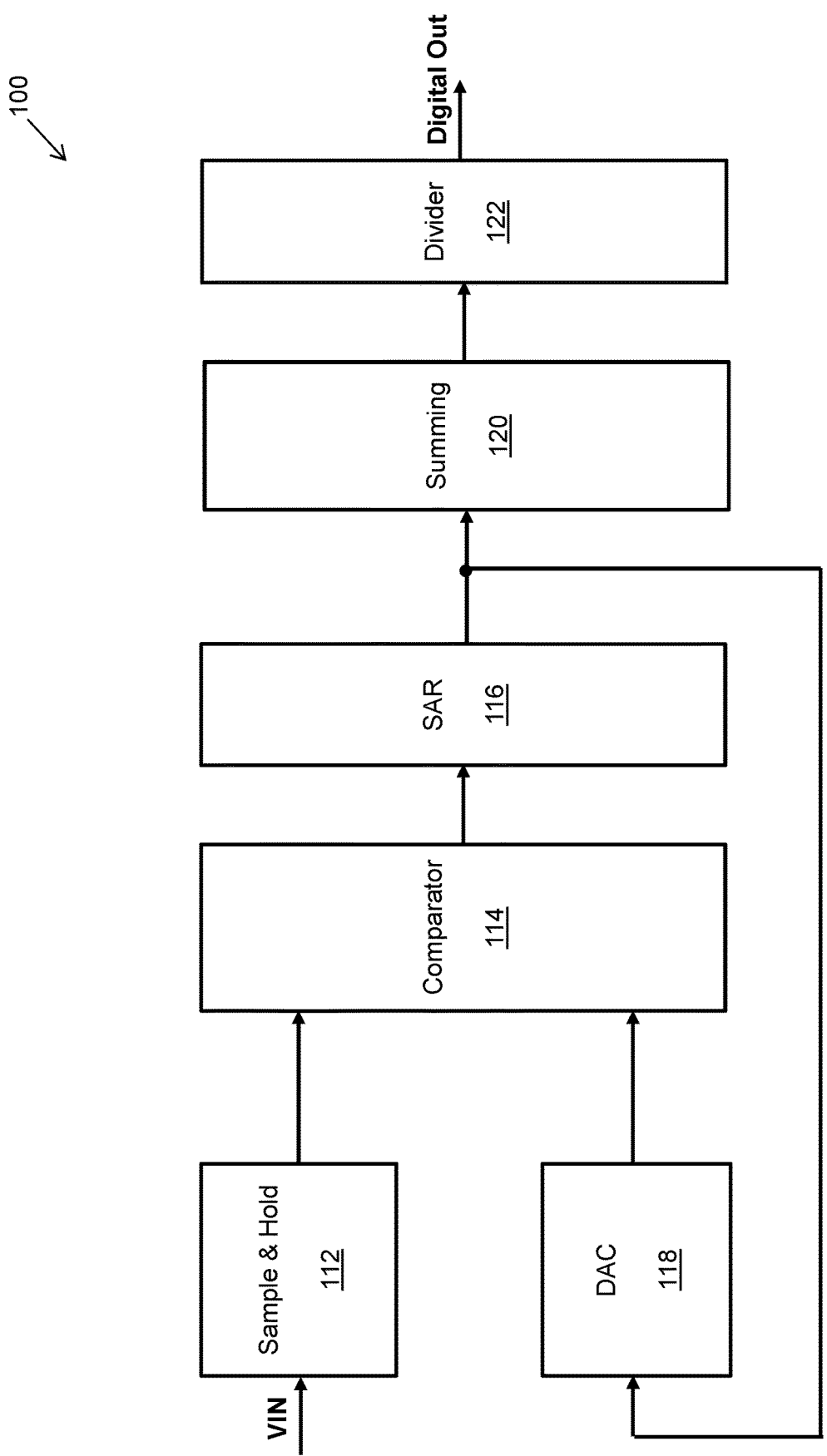
FIG. 1 illustrates a block diagram of a successive approximation ADC in accordance with various embodiments of the present disclosure.

FIG. 1 illustrates a block diagram of a successive approximation ADC in accordance with various embodiments of the present disclosure. The successive approximation ADC 100 comprises a sample and hold block 112, a comparator 114, a successive approximation logic block 116, a digital-to-analog converter (DAC) 118, a summing block 120 and a divider block 122. The successive approximation ADC 100 further comprises a digitally controlled offset voltage (not shown but illustrated in FIGS. 2-5). Depending on different design needs, the digitally controlled offset voltage may be added into the input voltage path (e.g., the successive approximation ADC 200 shown in FIG. 2). Alternatively, the digitally controlled offset voltage may be added into the ADC reference voltage path (e.g., the successive approximation ADC 300 shown in FIG. 3). Furthermore, the digitally controlled offset voltage may be added into the input voltage path through a voltage buffer (e.g., the successive approximation ADC 400 shown in FIG. 4).

In some embodiments, the successive approximation ADC 100 may be implemented as a 10-bit ADC. By employing the digitally controlled offset voltage, the successive approximation ADC 100 can be extended to a higher resolution ADC (e.g., an 11-bit ADC or a 12-bit ADC).

As shown in FIG. 1, the sample and hold block 112 is configured to receive an input signal VIN. VIN is an analog signal. The sample and hold block 112 may be configured to operate in either a sampling phase or a conversion phase. In the sampling phase, an internal switch is turned on. The input signal VIN may be sampled and stored at a holding circuit. In some embodiments, the sampled voltage may be stored on a capacitor, a capacitor network and the like. In the conversion phase, the internal switch may be turned off to hold the sampled voltage on the capacitor. This sampled voltage can then be provided to the comparator 114. Through a successive comparison process, the successive approximation ADC 100 generates a digital output corresponding to the input signal VIN.

As shown in FIG. 1, the output of the sample and hold block 112 is fed into a first input of the comparator 114. A second input of the comparator 114 is configured to receive an output signal generated by the DAC 118. The DAC 118 is employed to convert a digital output signal generated by the successive approximation logic block 116 into a corresponding analog signal. This analog signal is compared with the output signal of the sample and hold block 112 at the comparator 114. The comparison result generated by the comparator 114 is fed into the successive approximation logic block 116. Based on the comparison result, the successive approximation logic block 116 generates a digital output signal corresponding to the input signal VIN.

In operation, the successive approximation ADC 100 determines the value of each bit of the digital output signal in a sequential manner based on the output of the comparator

114. The successive approximation ADC 100 starts the conversion phase by temporally setting the most significant bit (MSB) of a digital word equal to 1, and all the other bits equal to 0. This digital word is applied to the DAC 118. In the DAC 118, an analog signal is generated based on the digital word.

This analog signal generated by the DAC 118 is compared to the input signal VIN. If the input signal VIN is greater than the analog signal generated by the DAC 118, the successive approximation logic block 116 sets the MSB of the digital word equal to 1. On the other hand, if the input signal VIN is less than the analog signal generated by the DAC 118, the successive approximation logic block 116 sets the MSB of the digital word equal to 0. After this comparison, the value of the MSB of the digital word has been determined.

The approximation process continues. In the next cycle, the second bit is temporally set to 1 and the remaining undetermined bits are set to 0. Once again, the output from the DAC 118 is compared to the input signal VIN. If the input signal VIN is greater than the analog signal generated by the DAC 118, the second bit is set to 1, otherwise to 0. After this comparison, the value of the second bit has been determined. The approximation process continues until the least significant bit (LSB) of the digital word has been determined. After the LSB of the digital word has been determined, one analog-to-digital conversion cycle is complete. The content of the digital word after the LSB has been determined represents the digital output of the successive approximation ADC 100.

In some embodiments, the successive approximation ADC 100 is configured to generate an N-bit digital signal. By employed a digitally controlled offset voltage having $2^{(K+1)}$ steps, the successive approximation ADC 100 is capable of generating an N+K bit digital signal to improve the resolution of the successive approximation ADC 100.

In operation, the digitally controlled offset voltage is added into the comparison stage of the successive approximation ADC 100. In some embodiments, the digitally controlled offset voltage has a periodic pattern. In each period, the digitally controlled offset voltage has $2^{(K+1)}$ steps. Each step has a value equal to an integer multiplying $2^{(-K)}$ of an analog voltage corresponding to the LSB of the N-bit digital signal. Throughout the description, the analog voltage corresponding to the LSB of the N-bit digital signal is alternatively referred to as ALSB. In each period, the digitally controlled offset voltage is in a range from $(2^{(-K)}-1)$ of ALSB to $(1-2^{(-K)})$ of ALSB. In each period, each step appears at least once, and the sum of the steps in one period is equal to zero.

The successive approximation analog-to-digital converter circuit (e.g., the successive approximation logic block 116) is configured to sequentially generate a $2^{(K+1)}$ number of N-bit digital signals based on the $2^{(K+1)}$ steps of the digitally controlled offset voltage. In the summing block 120, the $2^{(K+1)}$ number of N-bit digital signals are added together and fed into the divider block 122. In the divider block 122, the summing result generated by the summing block 120 is divided by 2 to obtain a digital signal having (N+K) bits. The detailed structure and operating principle of the digitally controlled offset voltage will be described below with respect to FIGS. 2-9.

Figure 2:
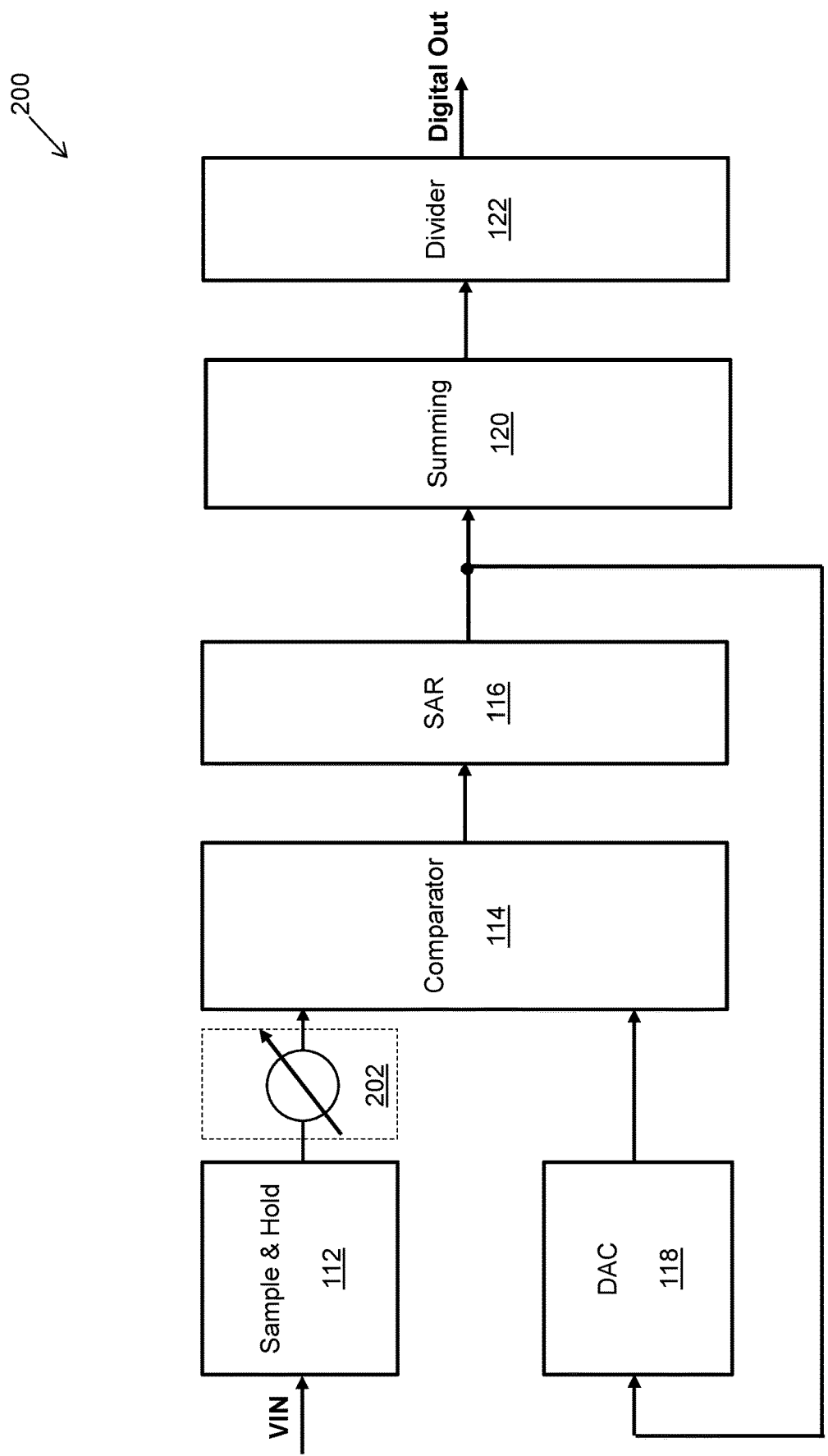
FIG. 2 illustrates a block diagram of a successive approximation ADC comprising a digitally controlled offset voltage added into the input voltage path in accordance with various embodiments of the present disclosure.

FIG. 2 illustrates a block diagram of a successive approximation ADC comprising a digitally controlled offset voltage added into the input voltage path in accordance with various embodiments of the present disclosure. A digitally controlled offset voltage 202 is added into the input voltage path of the successive approximation ADC 200. As shown in FIG. 2, the digitally controlled offset voltage 202 is placed between the output of the sample and hold block 112 and a first input of the comparator 114. The output voltage of the sample and hold block 112 and the digitally controlled offset voltage 202 are added together. The sum of the output voltage of the sample and hold block 112 and the digitally controlled offset voltage 202 is fed into the first input of the comparator 114.

In some embodiments, the digitally controlled offset voltage 202 has $2^{(K+1)}$ steps. Each step of the $2^{(K+1)}$ steps has a value equal to an integer multiplying $2^{(-K)}$ of the ALSB of an N-bit digital signal. The $2^{(K+1)}$ steps are added into the input voltage path. The successive approximation analog-to-digital converter circuit is configured to sequentially generate a $2^{(K+1)}$ number of N-bit digital signals based on the $2^{(K+1)}$ steps of the digitally controlled offset voltage 202. The $2^{(K+1)}$ number of N-bit digital signals are fed into the summing block 120. In the summing block 120, the $2^{(K+1)}$ number of N-bit digital signals is added together. The sum is fed into the divider block 122. In the divider block 122, the sum is divided by 2 to obtain a digital signal having (N+K) bits. The successive approximation analog-to-digital converter circuit repeats this analog-to-digital conversion process. The detailed process will be discussed below with respect to FIG. 6.

When K is equal to 1, the digitally controlled offset voltage 202 has 4 steps. The offsets of the digitally controlled offset voltage 202 are in a range from −ALSB/2 to ALSB/2. The offset of the first step is equal to 0. The offset of the second step is equal to ALSB/2. The offset of the third step is equal to 0. The offset of the fourth step is equal to −ALSB/2. When K is equal to 2, the digitally controlled offset voltage 202 has 8 steps. The offsets of the digitally controlled offset voltage 202 are in a range from −ALSB×¾ to ALSB×¾. The offset of the first step is equal to 0. The offset of the second step is equal to ALSB/4. The offset of the third step is equal to ALSB×¾. The offset of the fourth step is equal to ALSB×¾. The offset of the fifth step is equal to 0. The offset of the sixth step is equal to −ALSB/4. The offset of the seventh step is equal to −ALSB×¾. The offset of the eighth step is equal to −ALSB×¾. It should be noted that in both examples above, the sequence of the offset voltage steps is arbitrary. The sequence of the offset voltage steps may vary as long as in each period, each step appears at least once and the sum of the steps in one period is equal to zero.

An example below is used to further illustrate the operating principle of the successive approximation ADC 200 shown in FIG. 2. In some embodiments, K=1 and N=4. The digitally controlled offset voltage 202 has 4 steps. The successive approximation ADC 200 without the digitally controlled offset voltage 202 is capable of generating a 4-bit digital signal. By adding the digitally controlled offset voltage 202, the successive approximation ADC 200 is capable of generating a 5-bit digital signal.

The full range of the successive approximation ADC 200 is 1.6 V. The value of the ALSB is 0.1 V. The digitally controlled offset voltage 202 has 4 steps. Each step is equal to one half of the ALSB (one half of 0.1 V). There are four steps. In a first step, the product of zero and ALSB is added into the input voltage path. In other words, the offset voltage is equal to 0 V. In a second step, the product of 0.5 and ALSB is added into the input voltage path. In other words, the offset voltage is equal to 0.05 V. In a third step, the product of zero and ALSB is added into the input voltage path. In other words, the offset voltage is equal to 0 V. In a fourth step, the product of −0.5 and ALSB is added into the input voltage path. In other words, the offset voltage is equal to −0.05 V.

In some embodiments, the input voltage is equal to 0.87 V. The binary number of the ADC reference voltage is 1000. The corresponding analog voltage is 0.8 V. When the ADC process starts, the successive approximation analog-to-digital converter circuit generates four 4-bit binary numbers based on four different steps. In a first step, the input voltage is added with 0 V. The successive approximation analog-to-digital converter circuit generates 1000 (in binary form). The corresponding decimal value is equal to 8. In a second step, the input voltage is added with 0.05 V. The total voltage of 0.92 V is fed into the comparator. The successive approximation analog-to-digital converter circuit generates 1001 (in binary form). The corresponding decimal value is equal to 9. In a third step, the input voltage is added with 0 V. The successive approximation analog-to-digital converter circuit generates 1000 (in binary form). The corresponding decimal value is equal to 8. In a fourth step, the input voltage is added with −0.05 V. The total voltage of 0.82 V is fed into the comparator. The successive approximation analog-to-digital converter circuit generates 1000 (in binary form). The corresponding decimal value is equal to 8.

The digital signal results of these four steps are added together and then divided by 2. The decimal value of the final result is equal to 17. The decimal value corresponds to a 5-bit binary number. In this example, N is equal to 4 and K is equal to 1. K is used to set up the steps of the digitally controlled offset voltage 202. N is the existing resolution of the successive approximation ADC. By adding the digitally controlled offset voltage into the input voltage path and applying the summation and division algorithm described above, the resolution of the successive approximation ADC 200 has been increased by K bits.

Figure 3:
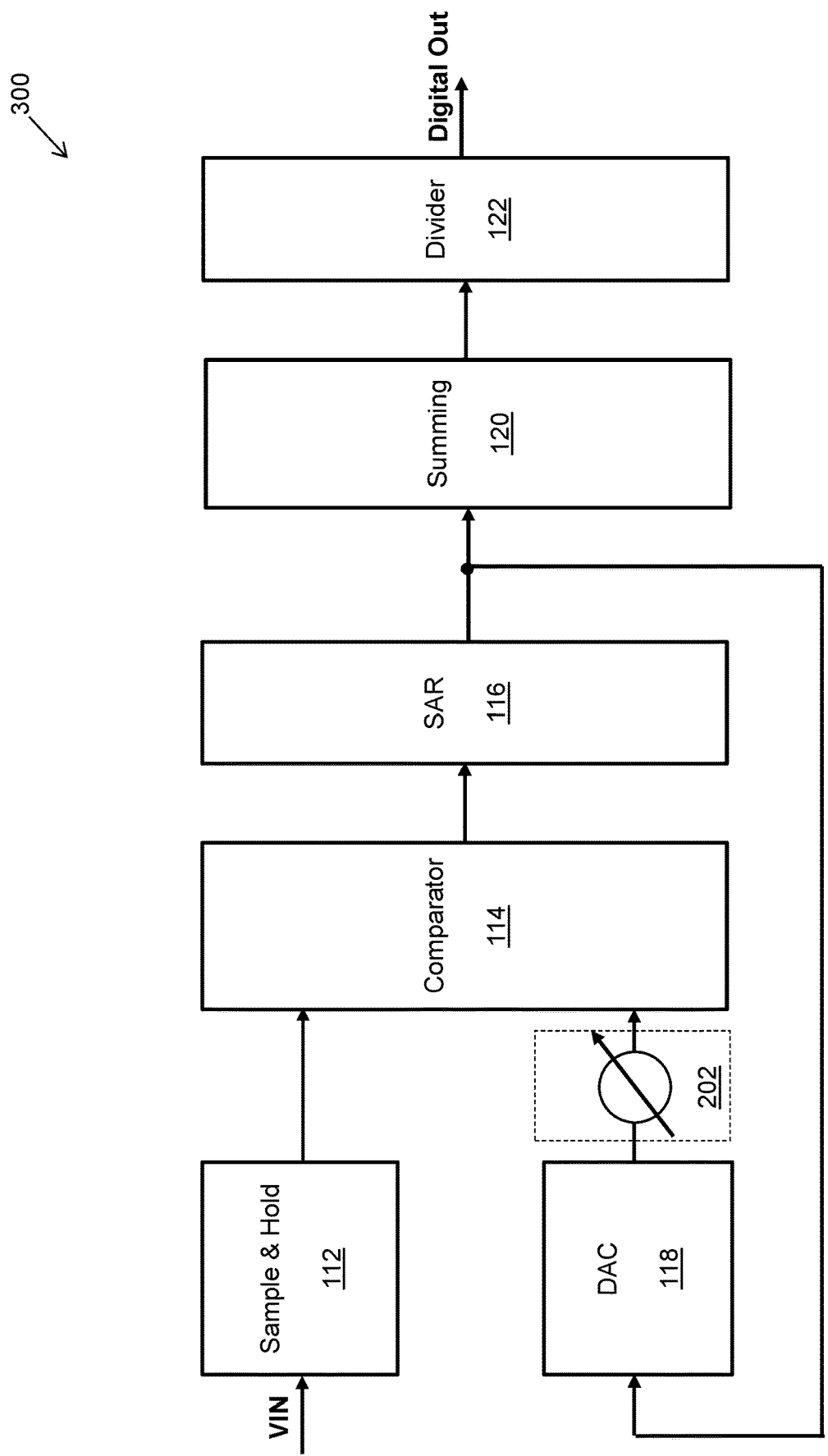
FIG. 3 illustrates a block diagram of a successive approximation ADC comprising a digitally controlled offset voltage added into the ADC reference voltage path in accordance with various embodiments of the present disclosure.

FIG. 3 illustrates a block diagram of a successive approximation ADC comprising a digitally controlled offset voltage added into the ADC reference voltage path in accordance with various embodiments of the present disclosure. The successive approximation ADC 300 shown in FIG. 3 is similar to the successive approximation ADC 200 shown in FIG. 2 except that the digitally controlled offset voltage 202 is added into the ADC reference voltage path. The operating principle of the successive approximation ADC 300 is similar to that discussed above with respect to FIG. 2, and hence is not discussed herein again.

Figure 4:
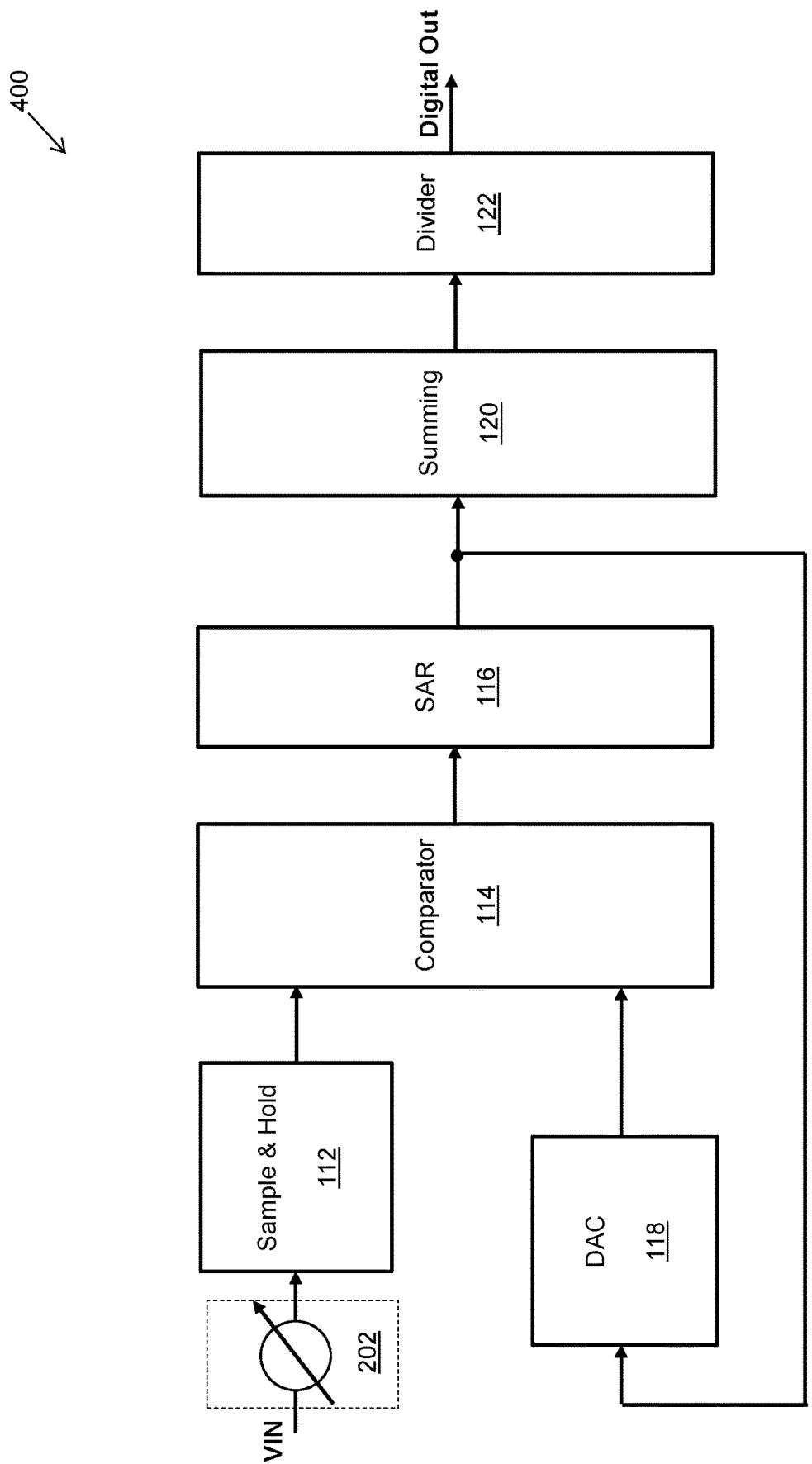
FIG. 4 illustrates a block diagram of a successive approximation ADC comprising a digitally controlled offset voltage added into the input voltage path through an input voltage buffer in accordance with various embodiments of the present disclosure.

FIG. 4 illustrates a block diagram of a successive approximation ADC comprising a digitally controlled offset voltage added into the input voltage path through an input buffer in accordance with various embodiments of the present disclosure. The successive approximation ADC 400 shown in FIG. 3 is similar to the successive approximation ADC 200 shown in FIG. 2 except that the digitally controlled offset voltage 202 is added into the input voltage path through an input voltage buffer (shown in FIG. 5). The operating principle of the successive approximation ADC 400 is similar to that discussed above with respect to FIG. 2, and hence is not discussed herein again.

Figure 5:
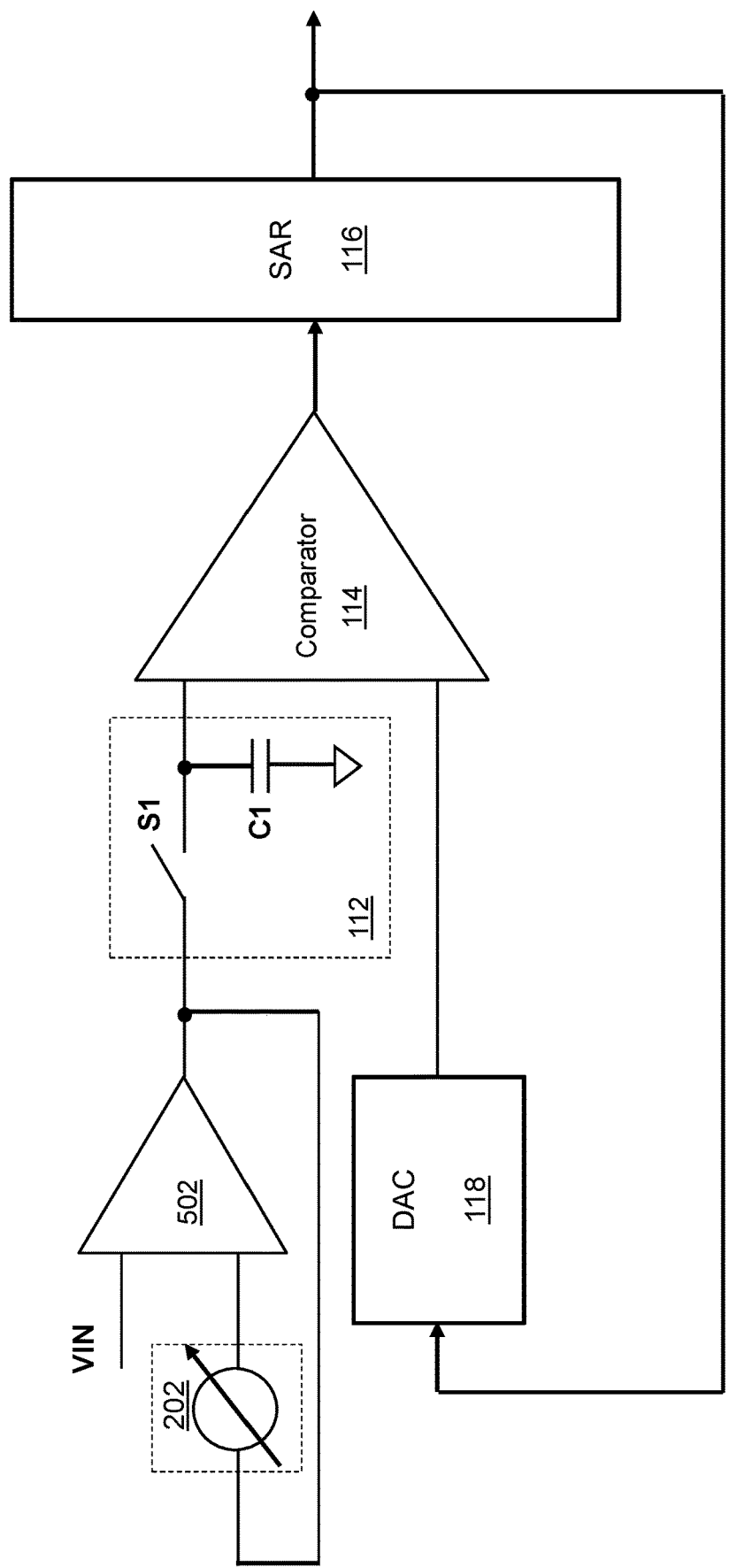
FIG. 5 illustrates a schematic diagram of the successive approximation ADC shown in FIG. 4 in accordance with various embodiments of the present disclosure.

FIG. 5 illustrates a schematic diagram of the successive approximation ADC shown in FIG. 4 in accordance with various embodiments of the present disclosure. The input voltage buffer may be implemented as a voltage follower shown in FIG. 5. Throughout the description, the input voltage buffer may be alternatively referred to as a voltage follower.

The voltage follower 502 is coupled to the sample and hold block 112. As shown in FIG. 5, the sample and hold block 112 comprises a switch S1 and a capacitor C1. The sample and hold circuit in the successive approximation ADC is well known in the art, hence is not discussed in detail for avoiding repetition.

The voltage follower 502 has a first input configured to receive the input voltage VIN and a second input connected to the output of the voltage follower 502 through the digitally controlled offset voltage 202. The output voltage of the voltage follower 502 is equal to the sum of the input voltage VIN and the digitally controlled offset voltage.

Figure 6:
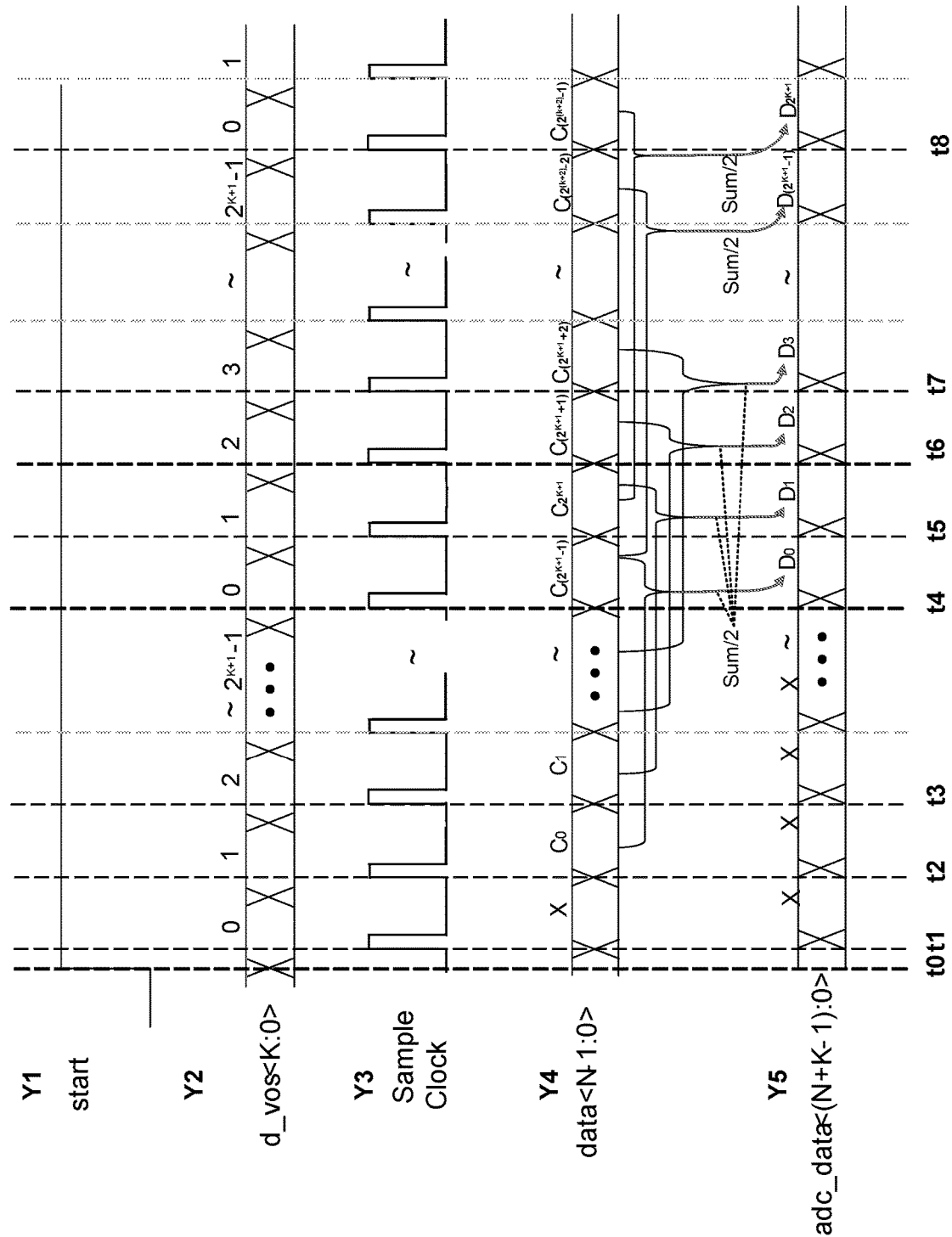
FIG. 6 illustrates a timing diagram of the successive approximation ADC shown in FIG. 2 in accordance with various embodiments of the present disclosure.

FIG. 6 illustrates a timing diagram of the successive approximation ADC shown in FIG. 2 in accordance with various embodiments of the present disclosure. The horizontal axis of FIG. 6 represents intervals of time. There are five vertical axes. The first vertical axis Y1 represents a start signal of the successive approximation ADC. The second vertical axis Y2 represents $2^{(K+1)}$ steps of the digitally controlled offset voltage (d_vos<K:0>). The third vertical axis Y3 represents the sampling clock. The fourth vertical axis Y4 represents the N-bit digital output signal (data<N−1:0>) of the successive approximation ADC. The fifth vertical axis Y5 represents (N+K)-bit digital output signal (adc_data<(N+K−1):0>) of the successive approximation ADC.

The digitally controlled offset voltage provides a periodic pattern. In each period, the digitally controlled offset voltage has $2^{(K+1)}$ steps. As shown in FIG. 6, a first period is from a first time instant t1 to a fourth time instant t4. The first period includes $2^{(K+1)}$ steps (from step 0 to step $2^{(K+1)}-1$) as shown in FIG. 6. The second period is from the fourth time instant t4 to an eighth time instant t8. The second period includes $2^{(K+1)}$ steps (from step 0 to step $2^{(K+1)}-1$) as shown in FIG. 6.

At the time instant t0, in response to the leading edge of the start signal, the analog-to-digital conversion starts. The first step of the digitally controlled offset voltage is added into the comparison stage of the successive approximation ADC (e.g., the first step is applied and stabilized, and ready to be added into the upcoming sampled analog voltage). After a suitable delay, at the first time instant t1, the sample and hold circuit obtains a sampled analog voltage from the input analog signal, and the first step of the digitally controlled offset voltage is added into the sampled signal. In response to this modified input voltage (the sum of the input voltage and the first step of the digitally controlled offset voltage), at a second time instant t2, the successive approximation ADC generates a first N-bit digital signal C0. Likewise, in the next analog-to-digital conversion cycle, the second step of the digitally controlled offset voltage is added into the comparison stage of the successive approximation ADC (e.g., the second step is added into the sampled analog voltage). In response to this modified input voltage (the sum of the input voltage and the second step of the digitally controlled offset voltage), at a third time instant t3, the successive approximation ADC generates a second N-bit digital signal C1. The successive approximation ADC repeats the analog-to-digital conversion by adding different steps of the digitally controlled offset voltage until at the fourth time instant t4, the successive approximation ADC generates the last N-bit digital signal $C(2^{(K+1)}-1)$.

After generating the N-bit digital signal $C(2^{(K+1)}-1)$, the summing block of the successive approximation ADC sums the $2^{(K+1)}$ number of N-bit digital signals (C0, C1, ..., $C(2^{(K+1)}-1)$) together. The divider block of the successive approximation ADC divides the sum of the $2^{(K+1)}$ number of N-bit digital signals by 2 to generate a first (N+K)-bit digital signal D0 as shown in FIG. 6.

In the subsequent analog-to-digital conversion cycles, the successive approximation ADC repeats the same analog-to-digital conversion process. In particular, from the fourth time instant t4 to the eighth time instant t8, $2^{(K+1)}$ steps of the second period of the digitally controlled offset voltage are added into the comparison stage of the successive approximation ADC. The successive approximation ADC sequentially generates a $2^{(K+1)}$ number of N-bit digital signals (C($2^{(K+1)}$), C($2^{(K+1)}$+1), . . . , C($2^{(K+2)}$−2) and C($2^{(K+2)}$−1)) as shown in FIG. 6.

As shown in FIG. 6, after generating the N-bit digital signal C($2^{(K+1)}$), the summing block of the successive approximation ADC sums the $2^{(K+1)}$ number of N-bit digital signals (C1, . . . , C($2^{(K+1)}$)) together. The divider block of the successive approximation ADC divides the sum of the $2^{(K+1)}$ number of N-bit digital signals by 2 to generate a second (N+K)-bit digital signal D1 at the fifth time instant t5 as shown in FIG. 6.

Likewise, after generating the N-bit digital signal C($2^{(K+1)}$+1), the summing block of the successive approximation ADC sums the $2^{(K+1)}$ number of N-bit digital signals (C2, . . . , C($2^{(K+1)}$+1)) together. The divider block of the successive approximation ADC divides the sum of the $2^{(K+1)}$ number of N-bit digital signals by 2 to generate a third (N+K)-bit digital signal D2 at the sixth time instant t6 as shown in FIG. 6.

Furthermore, after generating the N-bit digital signal C($2^{(K+1)}$+2), the summing block of the successive approximation ADC sums the $2^{(K+1)}$ number of N-bit digital signals (C3, . . . , C($2^{(K+1)}$+2)) together. The divider block of the successive approximation ADC divides the sum of the $2^{(K+1)}$ number of N-bit digital signals by 2 to generate a fourth (N+K)-bit digital signal D3 at the sixth time instant t7 as shown in FIG. 6.

The successive approximation ADC repeats this analog-to-digital conversion process. At the eighth time instant t8, the summing block of the successive approximation ADC sums the $2^{(K+1)}$ number of N-bit digital signals (C($2^{(K+1)}$), . . . , C($2^{(K+2)}$−1)) together. The divider block of the successive approximation ADC divides the sum of the $2^{(K+1)}$ number of N-bit digital signals by 2 to generate a (N+K)-bit digital signal D($2^{(K+1)}$).

It should be noted the signals labelled with X shown in FIG. 6 are unknown signals. The unknown signals should be ignored during the analog-to-digital conversion process. As shown in FIG. 6, without having the digitally controlled offset voltage and the associated higher resolution ADC, C0 is the first digital output signal of the successive approximation ADC. After having the digitally controlled offset voltage and the associated higher resolution ADC, D0 is the first digital output signal of the successive approximation ADC. From t2 to t4, there are ($2^{(K+1)}$−1) analog-to-digital conversion cycles. In other words, the higher resolution ADC only brings a delay equal to ($2^{(K+1)}$−1) analog-to-digital conversion cycles.

Figure 7:
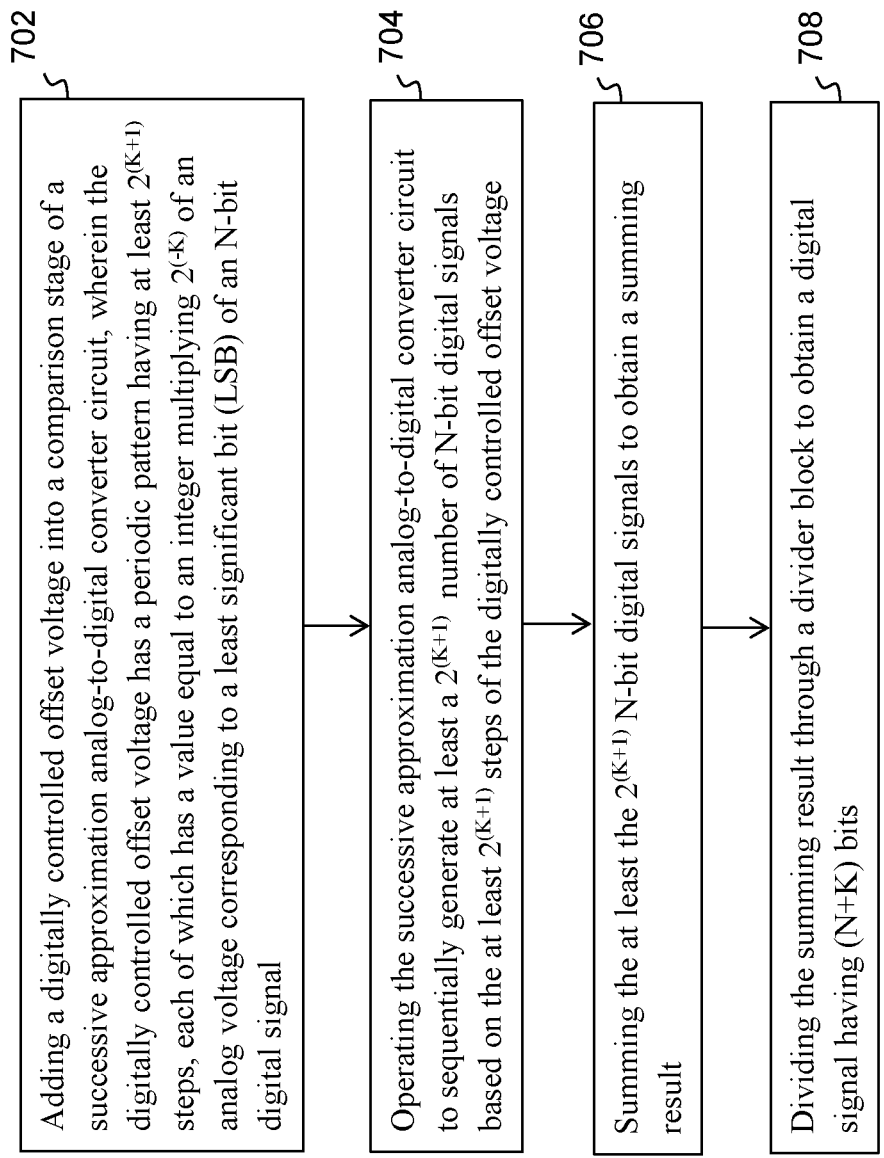
FIG. 7 illustrates a flow chart of a method for achieving a higher resolution ADC in accordance with various embodiments of the present disclosure.

FIG. 7 illustrates a flow chart of a method for achieving a higher resolution ADC in accordance with various embodiments of the present disclosure. This flowchart shown in FIG. 7 is merely an example, which should not unduly limit the scope of the claims. One of ordinary skill in the art would recognize many variations, alternatives, and modifications. For example, various steps illustrated in FIG. 7 may be added, removed, replaced, rearranged and repeated.

At step 702, a digitally controlled offset voltage is added into a comparison stage of a successive approximation analog-to-digital converter circuit. The digitally controlled offset voltage has a periodic pattern including at least $2^{(K+1)}$ steps. Each step has a value equal to an integer multiplying $2^{(-K)}$ of an analog signal corresponding to a least significant bit (LSB) of an N-bit digital signal.

At step 704, the successive approximation analog-to-digital converter circuit is configured to sequentially generate a $2^{(K+1)}$ number of N-bit digital signals based on the at least the $2^{(K+1)}$ steps of the digitally controlled offset voltage.

At step 706, the $2^{(K+1)}$ number of N-bit digital signals is added together in a summing block to obtain a summing result.

At step 708, the summing result generated by the summing block is divided through a divider block to obtain a digital signal having (N+K) bits.

In each period of the digitally controlled offset voltage, each step appears at least once, and the sum of the steps in one period is equal to zero. In the divider block, the summing result is divided by 2 to obtain the digital signal having (N+K) bits.

The method further comprises placing the digitally controlled offset voltage between an output of a sample and hold block and a first input of the comparison stage, wherein an output voltage of the sample and hold block and the digitally controlled offset voltage are added together, and a sum of the output voltage of the sample and hold block and the digitally controlled offset voltage is fed into the first input of the comparison stage.

The method further comprises placing the digitally controlled offset voltage between an output of a digital-to-analog converter circuit and a second input of the comparison stage, wherein an output voltage of the digital-to-analog converter circuit and the digitally controlled offset voltage are added together, and a sum of the output voltage of the digital-to-analog converter circuit and the digitally controlled offset voltage is fed into the second input of the comparison stage.

The method further comprises placing the digitally controlled offset voltage at an input of a sample and hold block, wherein the digitally controlled offset voltage and an output voltage of the sample and hold block are added together, and a sum of the output voltage of the sample and hold block and the digitally controlled offset voltage is fed into a first input of the comparison stage.

The digitally controlled offset voltage is coupled to the sample and hold block through an input voltage buffer. The input voltage buffer is a voltage follower. The voltage follower has a first input configured to receive the analog input signal, and a second input connected to an output of the voltage follower through the digitally controlled offset voltage, and wherein an output voltage of the voltage follower is equal to a sum of the analog input signal and the digitally controlled offset voltage.

The digital signal having (N+K) bits is generated after a delay equal to ($2^{(K+1)}$−1) analog-to-digital conversion cycles.

In some embodiments, the digitally controlled offset voltage pattern can be further simplified to have only $2^{(K+1)}$−1 steps. The $2^{(K+1)}$−1 steps can enable the successive approximation ADC 100 to generate an (N+K) bit digital signal to improve the resolution of the successive approximation ADC 100.

Similarly, in operation, the digitally controlled offset voltage is added into the comparison stage of the successive approximation ADC 100. In some embodiments, the digitally controlled offset voltage has a periodic pattern. In each period, the digitally controlled offset voltage has ($2^{(K+1)}$−1) steps. Each step has a value equal to an integer multiplying $2^{(-K)}$ of the ALSB. The values of the steps are in a range from $(2^{(-K)}-1)$ of the ALSB to $(1-2^{(-K)})$ of the ALSB. In each period, each step appears at least once and the sum of the steps in one period is equal to zero. More specifically, the digitally controlled offset voltage steps comprise the following $2^{(K+1)}-1$ values: $\{(2^{(-K)}-1), (2\cdot2^{(-K)}-1), (3\cdot2^{(-K)}-1), ((2^{(-K)}-1)\cdot2^{(-K)}-1), 0, (1-(2^{(K)}-1)\cdot2^{(-K)}), (1-3\cdot2^{(-K)}), (1-2\cdot2^{(-K)}), (1-2^{(-K)})\}$ with an arbitrary order.

The successive approximation analog-to-digital converter circuit is configured to sequentially generate a $2^{(K+1)}-1$ number of N-bit digital signals based on the $(2^{(K+1)}-1)$ steps of the digitally controlled offset voltage. The $(2^{(K+1)}-1)$ number of N-bit digital signals are fed into the summing block 120. In the summing block 120, the $(2^{(K+1)}-1)$ number of N-bit digital signals are added together. The voltage offset corresponding to 0 is added twice to the sum. The sum is then fed into the divider block 122. In the divider block 122, the sum is divided by 2 to obtain a digital signal having (N+K) bits. The successive approximation analog-to-digital converter circuit repeats this analog-to-digital conversion process. The detailed process will be discussed below with respect to FIG. 8.

In some embodiments, when K is equal to 1, the digitally controlled offset voltage 202 has 3 steps. The offsets of the digitally controlled offset voltage 202 have values of –ALSB/2, 0 and ALSB/2. The offset of the first step may be set to be 0. The offset of the second step may be set to be ALSB/2. The offset of the third step may be set to be –ALSB/2. When K is equal to 2, the digitally controlled offset voltage 202 has 7 steps. The offsets of the digitally controlled offset voltage 202 have values of –ALSB×¾, —ALSB/2, —ALSB/4, 0, ALSB/4, ALSB/2 and ALSB×¾. The offset of the first step may be set to be 0. The offset of the second step may be set to be ALSB/4. The offset of the third step may be set to be ALSB/2. The offset of the fourth step may be set to be ALSB×¾. The offset of the fifth step may be set to be –ALSB/4. The offset of the sixth step may be set to be –ALSB/2. The offset of the seventh step may be set to be –ALSB×¾. It should be noted that in both examples above, the sequence of the offset voltage steps is arbitrary, as long as in each period, each integer multiplying $2^{(-K)}$ of the ALSB appears once and the sum of the steps in one period is equal to zero. It should further be noted that an integer multiplying $2^{(-K)}$ of the ALSB has a value in a range from $(2^{(-K)}-1)$ to $(1-2^{(-K)})$ of the ALSB.

An example below is used to further illustrate the operating principle of the successive approximation ADC 200 shown in FIG. 2. In some embodiments, K=1 and N=4. The digitally controlled offset voltage 202 has 3 steps. The successive approximation ADC 200 without the digitally controlled offset voltage 202 is capable of generating a 4-bit digital signal. By adding the digitally controlled offset voltage 202, the successive approximation ADC 200 is capable of generating a 5-bit digital signal.

The full range of the successive approximation ADC 200 is 1.6 V. The value of the ALSB is 0.1 V. The digitally controlled offset voltage 202 has three steps. Each step is equal to one half of the ALSB (one half of 0.1 V). There are three steps. In a first step, the product of zero and ALSB is added into the input voltage path. In other words, the offset voltage is equal to 0 V. In a second step, the product of 0.5 and ALSB is added into the input voltage path. In other words, the offset voltage is equal to 0.05 V. In a third step, the product of –0.5 and ALSB is added into the input voltage path. In other words, the offset voltage is equal to –0.05 V.

In some embodiments, the input voltage is equal to 0.87 V. The binary number of the ADC reference voltage is 1000. The corresponding analog voltage is 0.8 V. When the ADC process starts, the successive approximation analog-to-digital converter circuit generates four 4-bit binary numbers based on three different steps. In a first step, the input voltage is added with 0 V. The successive approximation analog-to-digital converter circuit generates 1000 (in binary form). The corresponding decimal value is equal to 8. In a second step, the input voltage is added with 0.05 V. The total voltage of 0.92 V is fed into the comparator. The successive approximation analog-to-digital converter circuit generates 1001 (in binary form). The corresponding decimal value is equal to 9. In a third step, the input voltage is added with –0.05 V. The total voltage of 0.82 V is fed into the comparator. The successive approximation analog-to-digital converter circuit generates 1000 (in binary form). The corresponding decimal value is equal to 8.

The digital signal results of these three steps are added together with the digital signal result corresponding to 0V offset (the first step in this example) added twice to form a weighted sum, and then the weighted sum is divided by 2. The decimal value of the final result is rounded up to the nearest integer value. In the current example, the final result is 17, which corresponds to an analog voltage of 8.5V. The decimal value corresponds to a 5-bit binary number 10001. In this example, N is equal to 4 and K is equal to 1. K is used to set up the steps of the digitally controlled offset voltage 202. N defines the existing resolution of the successive approximation ADC. By adding the digitally controlled offset voltage into the input voltage path and applying the summation and division algorithm described above, the resolution of the successive approximation ADC 200 has been increased by K bits.

Figure 8:
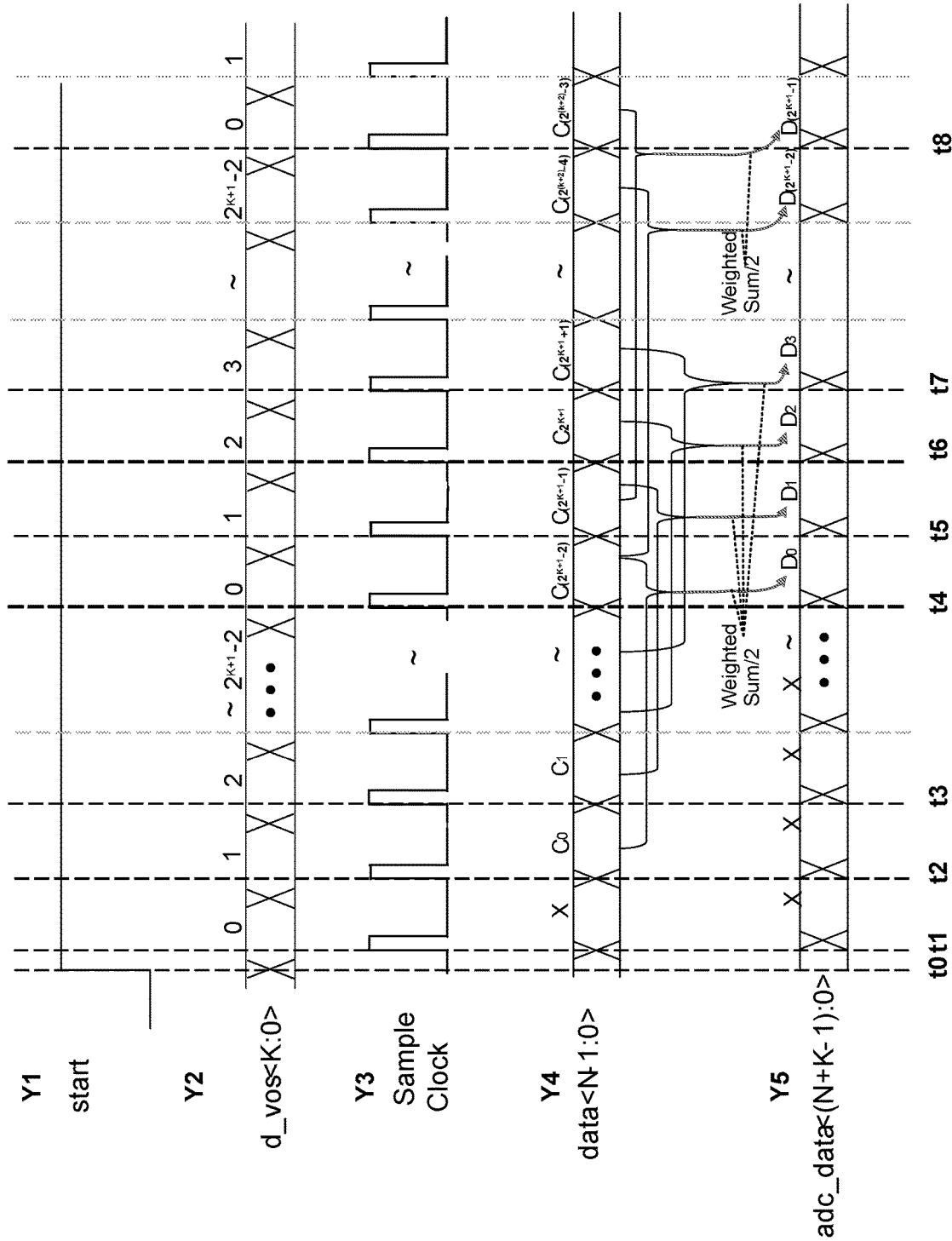
FIG. 8 illustrates another timing diagram of the successive approximation ADC shown in FIG. 2 in accordance with various embodiments of the present disclosure.

FIG. 8 illustrates another timing diagram of the successive approximation ADC shown in FIG. 2 in accordance with various embodiments of the present disclosure. The horizontal axis of FIG. 8 represents intervals of time. There are five vertical axes. The first vertical axis Y1 represents a start signal of the successive approximation ADC. The second vertical axis Y2 represents $2^{(K+1)}-1$ steps of the digitally controlled offset voltage (d_vos<K:0>). The third vertical axis Y3 represents the sampling clock. The fourth vertical axis Y4 represents the N-bit digital output signal (data<N–1:0>) of the successive approximation ADC. The fifth vertical axis Y5 represents (N+K)-bit digital output signal (adc_data<(N+K–1):0>) of the successive approximation ADC.

The digitally controlled offset voltage provides a periodic pattern. In each period, the digitally controlled offset voltage has $2^{(K+1)}-1$ steps. As shown in FIG. 8, a first period is from a first time instant t1 to a fourth time instant t4. The first period includes $(2^{(K+1)}-1)$ steps (from step 0 to step $(2^{(K+1)}-2)$) as shown in FIG. 8. The second period is from the fourth time instant t4 to an eighth time instant t8. The second period includes $(2^{(K+1)}-1)$ steps (from step 0 to step $(2^{(K+1)}-2)$) as shown in FIG. 8.

At the time instant t0, in response to the leading edge of the start signal, the analog-to-digital conversion starts. The first step of the digitally controlled offset voltage is added into the comparison stage of the successive approximation ADC (e.g., the first value is applied and stabilized, and ready to be added into the upcoming sampled analog voltage). After a suitable delay, at the first time instance t1, the sample and hold circuit obtains a sampled analog voltage from the input analog signal, then the first step of the digitally controlled offset voltage is added to the sampled signal. In response to this modified input voltage (the sum of the input voltage and the first step of the digitally controlled offset voltage), at a second time instant t2, the successive approximation ADC generates a first N-bit digital signal C0. Likewise, in the next analog-to-digital conversion cycle, the second step of the digitally controlled offset voltage is added into the comparison stage of the successive approximation ADC (e.g., the second step is added into the sampled analog voltage). In response to this modified input voltage (the sum of the input voltage and the second step of the digitally controlled offset voltage), at a third time instant t3, the successive approximation ADC generates a second N-bit digital signal C1. The successive approximation ADC repeats the analog-to-digital conversion by adding different steps of the digitally controlled offset voltage until at the fourth time instant t4, the successive approximation ADC generates the last N-bit digital signal $C(2^{(K+1)}-2)$.

After generating the N-bit digital signal $C(2^{(K+1)}-2)$, the $(2^{(K+1)}-1)$ number of N-bit digital signals (C0, C1, ..., $C(2^{(K+1)}-2)$) are processed in the summing block of the successive approximation ADC, where $2^{(K+1)}$ numbers are summed. The $2^{(K+1)}$ numbers include C0, C1, ..., $C(2^{(K+1)}-2)$ and an N-bit digital signal corresponding to an output signal of the successive approximation ADC when the digitally controlled offset voltage is 0. This N-bit digital signal could be anyone of $C0-C(2^{(K+1)}-2)$ depending on the actual sequence of the offset steps. The divider block of the successive approximation ADC divides the sum of the $2^{(K+1)}$ number of the N-bit digital signals by 2 to generate a first (N+K)-bit digital signal D0 as shown in FIG. 8.

In the subsequent analog-to-digital conversion cycles, the successive approximation ADC repeats the same analog-to-digital conversion process. In particular, from the fourth time instant t4 to the eighth time instant t8, $(2^{(K+1)}-1)$ steps of the second period of the digitally controlled offset voltage are added into the comparison stage of the successive approximation ADC. The successive approximation ADC sequentially generates a $(2^{(K+1)}-1)$ number of N-bit digital signals ($C(2^{(K+1)}-1)$, $C(2^{(K+1)})$, $C(2^{(K+1)}+1)$, ..., and $C(2^{(K+2)}-3)$) as shown in FIG. 8.

As shown in FIG. 8, after generating the N-bit digital signal $C(2^{(K+1)}-1)$, the summing block of the successive approximation ADC sums the $2^{(K+1)}$ number of N-bit digital signals including C1, ..., $C(2^{(K+1)}-1)$ and an N-bit digital signal corresponding to the output signal of the successive approximation ADC when the digitally controlled offset voltage is 0. This N-bit digital signal could be anyone of $C1-C(2^{(K+1)}-1)$ depending on the actual sequence of the voltage offset steps. The sum is then fed into the divider block of the successive approximation ADC where the sum of the $2^{(K+1)}$ number of N-bit digital signals is divided by 2 to generate a second (N+K)-bit digital signal D1 at the fifth time instant t5 as shown in FIG. 8.

Likewise, after generating the N-bit digital signal $C(2^{(K+1)})$, the summing block of the successive approximation ADC sums the $2^{(K+1)}$ number of N-bit digital signals including C2, ..., $C(2^{(K+1)})$ and an N-bit digital signal corresponding to the output signal of the successive approximation ADC when the digitally controlled offset voltage is 0. The N-bit digital signal could be anyone of $C2-C(2^{(K+1)})$ depending on the actual sequence of the offset steps. The sum is then fed into the divider block of the successive approximation ADC where the sum of the $2^{(K+1)}$ number of the N-bit digital signals is divided by 2 to generate a third (N+K)-bit digital signal D2 at the sixth time instant t6 as shown in FIG. 8.

Furthermore, after generating the N-bit digital signal $C(2^{(K+1)}+1)$, the summing block of the successive approximation ADC sums the $2^{(K+1)}$ number of N-bit digital signals including C3, ..., $C(2^{(K+1)}+1)$ and an N-bit digital signal corresponding to the output signal of the successive approximation ADC when the digitally controlled offset voltage is 0. This N-bit digital signal could be anyone of $C3 \sim C(2^{(K+1)}+1)$ depending on the actual sequence of the voltage offset steps. The sum is then fed into the divider block of the successive approximation ADC where the sum of the $2^{(K+1)}$ number of the N-bit digital signals is divided by 2 to generate a fourth (N+K)-bit digital signal D3 at the sixth time instant t7 as shown in FIG. 8.

The successive approximation ADC repeats this analog-to-digital conversion process. At the eighth time instant t8, the summing block of the successive approximation ADC sums the $2^{(K+1)}$ number of N-bit digital signals including ($C(2^{(K+1)}-1)$, ..., $C(2^{(K+2)}-3)$) and an N-bit digital signal corresponding to the output signal of the successive approximation ADC when the digitally controlled offset voltage is 0. The N-bit digital signal could be anyone of $C(2^{(K+1)}-1) \sim C(2^{(K+2)}-3)$ depending on the actual sequence of the voltage offset steps. The sum is then fed into the divider block of the successive approximation ADC where the sum of the $2^{(K+1)}$ number of the N-bit digital signals is divided by 2 to generate an (N+K)-bit digital signal $D(2^{(K+1)}-1)$ as shown in FIG. 8.

It should be noted the signals labelled with X shown in FIG. 8 are unknown signals. The unknown signals should be ignored during the analog-to-digital conversion process. As shown in FIG. 8, without having the digitally controlled offset voltage and the associated higher resolution ADC, C0 is the first digital output signal of the successive approximation ADC. After having the digitally controlled offset voltage and the associated higher resolution ADC, D0 is the first digital output signal of the successive approximation ADC. From t2 to t4, there are $(2^{(K+1)}-2)$ analog-to-digital conversion cycles. In other words, the higher resolution ADC only brings a delay equal to $(2^{(K+1)}-2)$ analog-to-digital conversion cycles.

It should further be noted that while in FIG. 8, the operating principle of the successive approximation ADC is described based on the embodiment shown in FIG. 2, the embodiments illustrated in FIGS. 3-5 are applicable to the successive approximation ADC described above with respect to FIG. 8.

Figure 9:
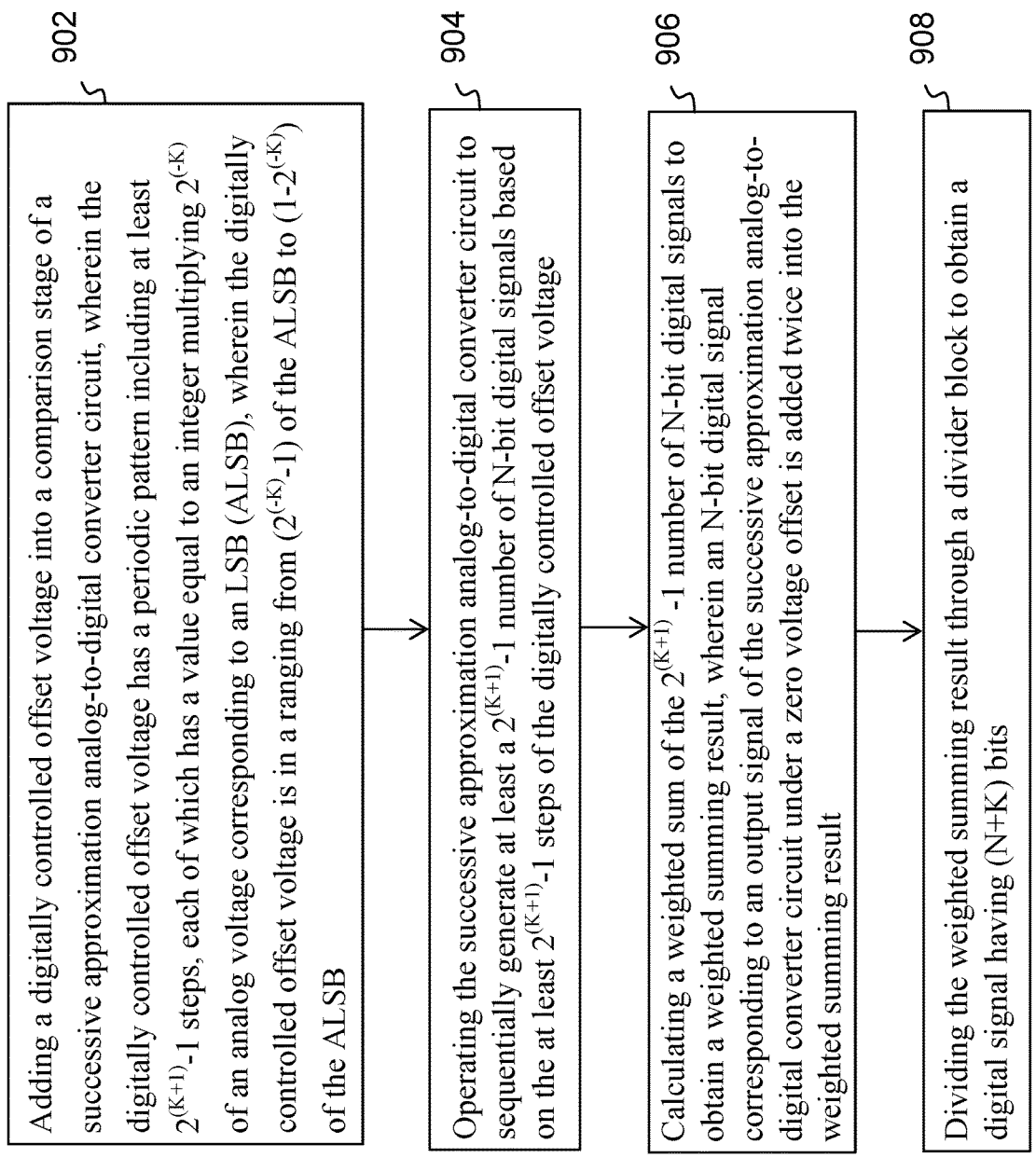
FIG. 9 illustrates a flow chart of another method for achieving a higher resolution ADC in accordance with various embodiments of the present disclosure.

FIG. 9 illustrates a flow chart of a method for achieving a higher resolution ADC in accordance with various embodiments of the present disclosure. This flowchart shown in FIG. 9 is merely an example, which should not unduly limit the scope of the claims. One of ordinary skill in the art would recognize many variations, alternatives, and modifications. For example, various steps illustrated in FIG. 9 may be added, removed, replaced, rearranged and repeated.

At step 902, a digitally controlled offset voltage is added into a comparison stage of a successive approximation analog-to-digital converter circuit. The digitally controlled offset voltage has a periodic pattern including at least $2^{(K+1)}-1$ steps. Each step has a value equal to an integer multiplying $2^{(-K)}$ of an ALSB ranging from $(2^{(-K)}-1)$ to $(1-2^{(-K)})$ of the ALSB.

At step 904, the successive approximation analog-to-digital converter circuit is configured to sequentially generate a $2^{(K+1)}-1$ number of N-bit digital signals based on the at least $2^{(K+1)}-1$ steps of the digitally controlled offset voltage.

At step 906, a weighted sum of the $2^{(K+1)}-1$ number of N-bit digital signals is calculated to obtain a weighted summing result, including the N-bit digital signal corresponding to the output signal of the successive approximation ADC when the digitally controlled offset voltage is 0. In other words, the output signal of the successive approximation ADC when the digitally controlled offset voltage is 0 is added twice in a summing block to obtain the weighted summing result.

At step 908, the weighted summing result generated by the summing block is divided through a divider block to obtain a digital signal having (N+K) bits.

In the divider block, the weighted summing result is divided by 2 to obtain the digital signal having (N+K) bits.

In each period of the digitally controlled offset voltage, each step appears at least once, and the sum of the steps in one period is equal to zero. The digital signal having (N+K) bits is generated after a delay equal to $(2^{(K+1)}-2)$ analog-to-digital conversion cycles.

In a capacitive SAR ADC device, in a sampling phase, the input voltage is connected to all capacitors. The capacitive SAR ADC device starts converting after sampling. Through successively redistributing the charges held in the capacitors, the capacitive SAR ADC device performs voltage comparisons with a fixed reference voltage. The capacitive (charge redistribution) SAR ADC device comprises a SAR logic unit configured to generate a plurality of bits. Different bits control different amounts of the total capacitance. For example, a first control bit bit<0> is used to control one capacitor with capacitance C. A second control bit bit<1> is used to control twice the capacitance (2×C). A third control bit bit<2> is used to control four times the capacitance (4×C). However, the capacitors controlled by each bit (either a single capacitor or a group of capacitors) are fixed during the conversion, so the mismatch in the manufacturing process of the capacitors will cause a large random error. It would be desirable to have a simple control scheme for reducing this random error. FIGS. 10-14 of the present disclosure address this need.

Figure 10:
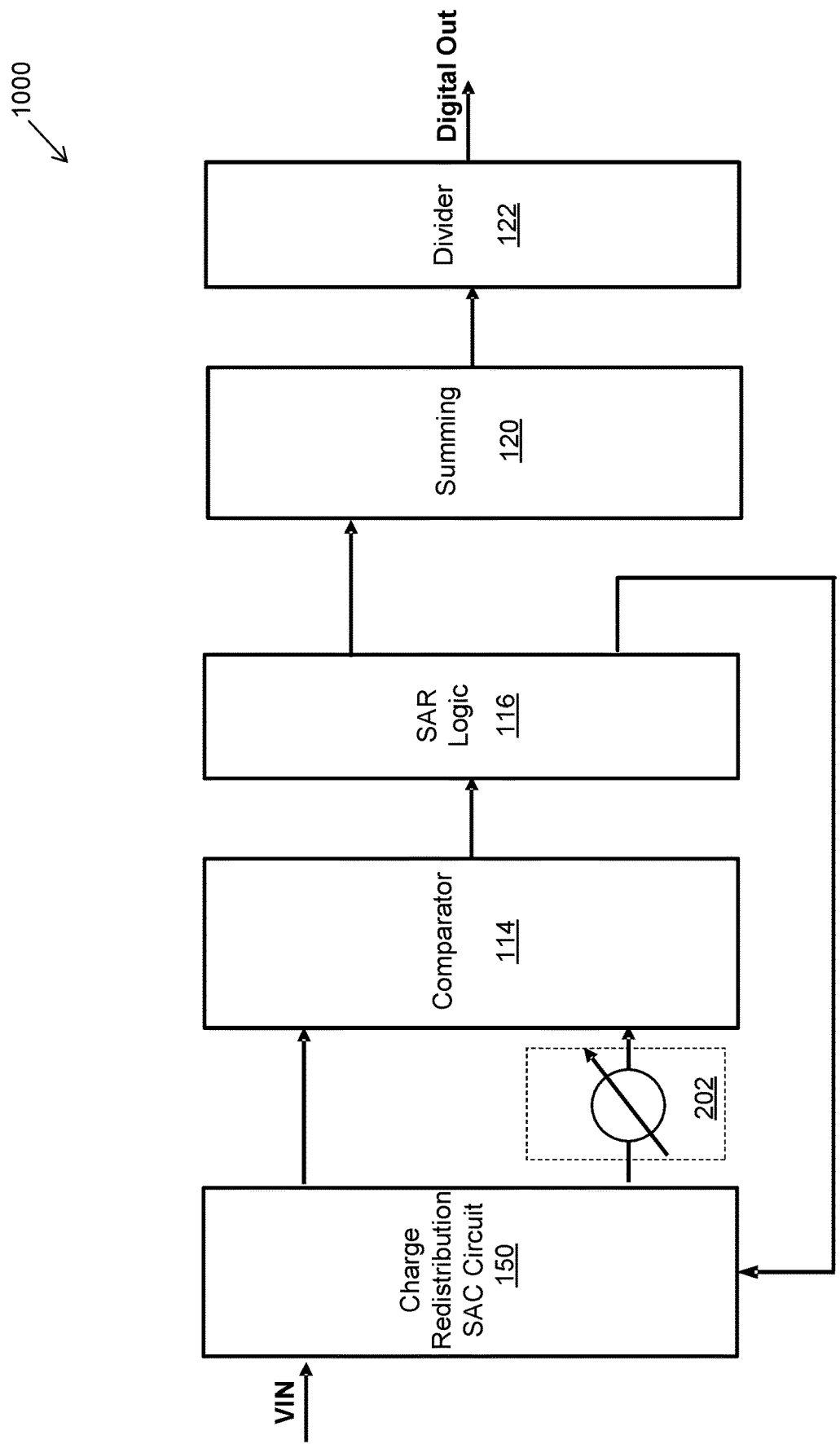
FIG. 10 illustrates a block diagram of a charge redistribution successive approximation ADC in accordance with various embodiments of the present disclosure.

FIG. 10 illustrates a block diagram of a charge redistribution successive approximation ADC in accordance with various embodiments of the present disclosure. The charge redistribution successive approximation ADC 1000 comprises a charge redistribution (Successive Approximation Capacitors) SAC circuit 150, a comparator 114, a successive approximation logic block 116, a summing block 120 and a divider block 122. The charge redistribution successive approximation ADC 1000 further comprises a digitally controlled offset voltage 202 fed into the comparator 114 as shown in FIG. 10.

In some embodiments, the charge redistribution successive approximation ADC 1000 may be implemented as a 6-bit ADC. By employing the digitally controlled offset voltage 202, the charge redistribution successive approximation ADC 1000 can be extended to a higher resolution ADC (e.g., an 8-bit ADC).

As shown in FIG. 10, the charge redistribution SAC circuit 150 is configured to receive an input signal VIN. VIN is an analog signal. The charge redistribution SAC circuit 150 comprises an array of individually switched binary weighted capacitors (e.g., C, 2C, 4C, . . . , $2^{n-1}$C). The charge redistribution SAC circuit 150 may be configured to operate in three different phases, namely a sampling phase, a hold phase and a charge redistribution phase.

In the sampling phase, all free terminals of the capacitors within the array are switched to the input signal VIN and their common terminals are connected to a common mode voltage VCM (e.g., ground). The capacitors have a charge equal to their respective capacitance times the input voltage. The total charge is equal to VIN×$2^n$×C stored in the capacitor array.

In the hold phase, the connections of the capacitor terminals are switched so that this charge is applied across the input of the comparator 114, where the common terminals of the capacitors are connected to the inverting input of the comparator 114 while the free terminals of the capacitors are connected to the common voltage VCM (e.g., ground). This configuration makes the voltage at the inverting input of the comparator 114 equal to —VIN (when VCM is connected to ground).

In the charge redistribution phase, the actual conversion process is performed by charge redistribution. First, the free terminal of the largest capacitor of the array of binary weighted capacitors is switched to a reference voltage bus (Vref). This reference voltage bus corresponds to the full-scale range of the ADC. The capacitors of the array are binary-weighted. As a result, the largest capacitor forms a 1:1 charge divider with the rest of the array connected in parallel. Thus, the voltage fed into to the comparator 114 is equal to (–Vin+Vref/2). If VIN is greater than (Vref/2), the comparator 114 generates a logic high signal and sets the most significant bit (MSB) equal to 1. Otherwise, the comparator generates a logic low state and sets the most significant bit equal to 0. After this comparison, the value of the MSB of the digital word has been determined and transferred to the SAR logic block 116, where based on the comparison result, the successive approximation logic block 116 generates a digital output signal corresponding to the input signal VIN. The SAR logic configures the free terminal of the largest capacitor connected to the reference voltage bus Vref for the rest of the conversion process if the comparator generates a logic high signal. Otherwise, the SAR logic configures the free terminal of the largest capacitor switched connected to the common mode reference voltage VCM. In the subsequent converter process, each capacitor is tested in the same manner until the least significant bit (LSB) of the digital word has been determined and stored in the SAR logic 116. After the LSB of the digital word has been determined, one analog-to-digital conversion cycle is complete. The content of the digital word after the LSB has been determined represents the digital output of the successive approximation ADC 100.

In some embodiments, as shown in FIG. 10, the output of the charge redistribution SAC circuit 150 is fed into a first input of the comparator 114. A second input of the comparator 114 is configured to receive a sum of the common mode reference voltage (e.g., VCM) and the digitally controlled offset voltage 202. The digitally controlled offset voltage 202 has been described above with respect to FIGS. 1-9, where in this application, for every analog to digital conversion cycle, a different voltage comprising a sum of a fixed VCM and a varying digitally controlled offset voltage 202 will be used.

The successive approximation ADC 100 is configured to generate an N-bit digital signal. By employing the digitally controlled offset voltage 202 having $2^{(K+1)}$ steps, the successive approximation ADC 100 is capable of generating an N+K bit digital signal to improve the resolution of the successive approximation ADC 100.

In operation, the digitally controlled offset voltage 202 is added into the comparison stage of the successive approximation ADC 100. In some embodiments, the digitally controlled offset voltage 202 has a periodic pattern. In each period, the digitally controlled offset voltage has $2^{(K+1)}$ steps. Each step has a value equal to an integer multiplying $2^{(-K)}$ of an analog voltage corresponding to the LSB of the N-bit digital signal. Throughout the description, the analog voltage corresponding to the LSB of the N-bit digital signal is alternatively referred to as ALSB. In each period, the digitally controlled offset voltage is in a range from $(2^{(-K)}-1)$ of ALSB to $(1-2^{(-K)})$ of ALSB. In each period, each step appears at least once, and the sum of the steps in one period is equal to zero.

The successive approximation analog-to-digital converter circuit (e.g., the successive approximation logic block 116) is configured to sequentially generate a $2^{(K+1)}$ number of N-bit digital signals based on the $2^{(K+1)}$ steps of the digitally controlled offset voltage 202. In the summing block 120, the $2^{(K+1)}$ number of N-bit digital signals are added together and fed into the divider block 122. In the divider block 122, the summing result generated by the summing block 120 is divided by 2 to obtain a digital signal having (N+K) bits.

Figure 11:
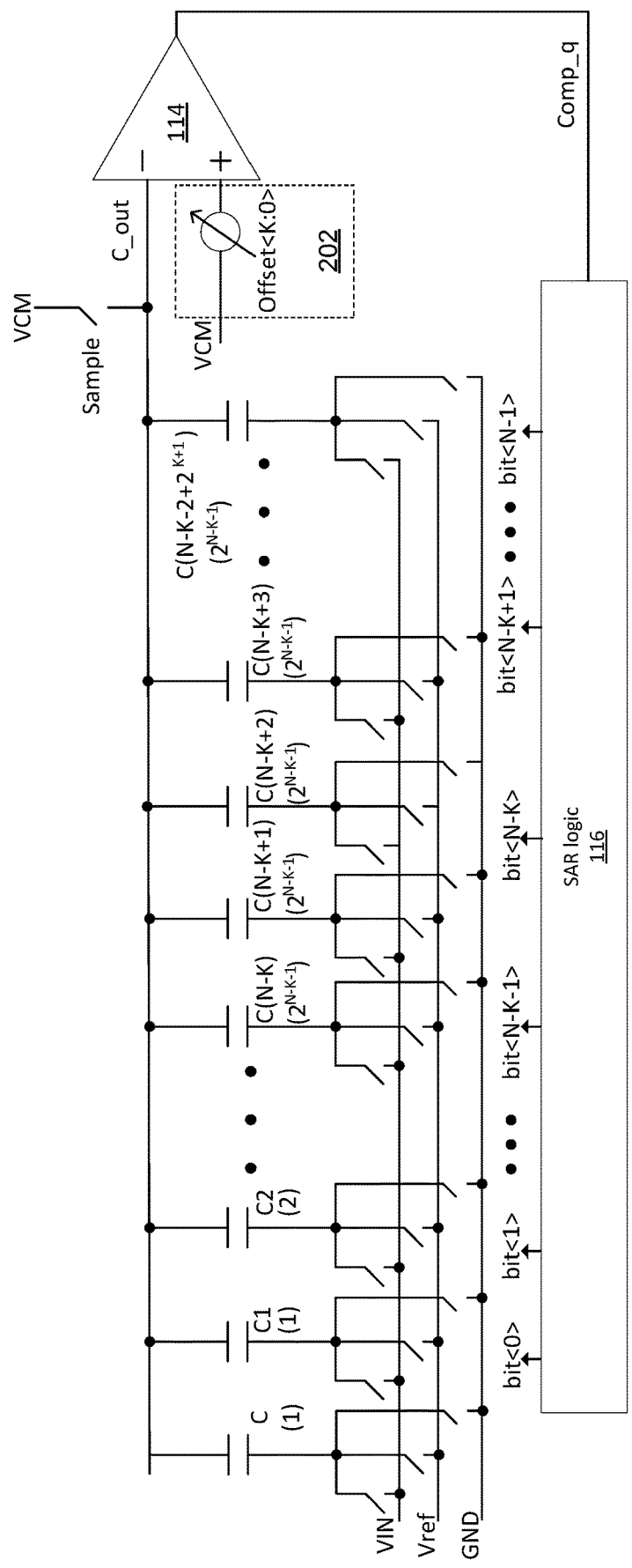
FIG. 11 illustrates a schematic diagram of the charge redistribution SAC circuit shown in FIG. 10 in accordance with various embodiments of the present disclosure.

FIG. 11 illustrates a schematic diagram of the charge redistribution SAC circuit shown in FIG. 10 in accordance with various embodiments of the present disclosure. The charge redistribution SAC circuit comprises a plurality of binary weighted capacitors C1, C2, . . . , C(N−K), C(N−K+1), C(N−K+2), C(N−K+3), . . . , C(N−K−2+$2^{K+1}$). As shown in FIG. 11, C1 is of a binary weight equal to 1. C2 is of a binary weight equal to 2. C(N−K), C(N−K+1), C(N−K+2), C(N−K+3), . . . , C(N−K−2+$2^{K+1}$) are of a binary weight equal to $2^{N-K-1}$. In other words, the plurality of binary weighted capacitors has a binary weight increasing by two times from a first capacitor to a (N−K)th capacitor, and a constant binary weight from the (N−K)th capacitor to an (N−K−2+$2^{(K+1)}$)th capacitor. The capacitors C and C1 have the same value. Only the free terminal of C1 is switched during the charge redistribution. The free terminal of the capacitor C remains connected to ground during charge redistribution.

The plurality of binary weighted capacitors C1, C2, . . . , C(N−K), C(N−K+1), C(N−K+2), C(N−K+3), . . . , C(N−K−2+$2^{K+1}$) are coupled between a first input terminal of the comparator 114 and a plurality of signal buses. The plurality of signal buses comprise an input signal bus VIN, a reference voltage bus Vref and a ground bus GND. In a sampling phase, the free terminals of the plurality of binary weighted capacitors are connected to the input signal bus VIN, while their common terminal is connected to a common mode voltage VCM (e.g., GND). In a hold phase, the free terminals of the plurality of binary weighted capacitors are connected to the ground bus GND while the common terminal is disconnected from VCM and connected to the first input terminal of the comparator 114. In a charge redistribution phase, the plurality of binary weighted capacitors is connected to the reference voltage bus Vref or the ground bus GND according to logic states of an N-bit control signal generated by the successive approximation logic block 116. As shown in FIG. 11, the successive approximation logic block 116 is configured to receive an output signal Comp_q generated by the comparator 114, and generate the N-bit control signal (from bit<0> to bit<N−1>) for controlling the plurality of binary weighted capacitors.

As shown in FIG. 11, a first bit (bit<0>) of the N-bit control signal is used to control the on/off of the switches associated with C1. A second bit (bit<1>) of the N-bit control signal is used to control the on/off of the switches associated with C2. An (N−K)th bit (bit<N−K−1>) of the N-bit control signal is used to control the on/off of the switches associated with C(N−K). An (N−K+1)th bit (bit<N−K>) of the N-bit control signal is used to control the on/off of the switches associated with C(N−K+1) and C(N−K+2). An (N−K+2)th bit (bit<N−K+1>) of the N-bit control signal is used to control the on/off of the switches associated with C(N−K+3), C(N−K+4), C(N−K+5), C(N−K+6) (not shown). An (N)th bit (bit<N−1>) of the N-bit control signal is used to control the on/off of the switches associated with the last $2^K$ capacitors including C(N−K−2+$2^{K+1}$).

An offset voltage generator (not shown) is configured to generate a digitally controlled offset voltage 202 having $2^{(K+1)}$ steps fed into a second input terminal of the comparator 114 on top of the common mode voltage VCM. The digitally controlled offset voltage has a periodic pattern including $2^{(K+1)}$ steps. In each period of the digitally controlled offset voltage, each step appears at least once, and a sum of the steps in one period is equal to zero. The successive approximation logic block 116 is configured to generate a $2^{(K+1)}$ number of N-bit digital signals based on the $2^{(K+1)}$ steps of the digitally controlled offset voltage 202.

A summing block (e.g., summing block 120 shown in FIG. 10) is configured to receive the $2^{(K+1)}$ number of N-bit digital signals generated by the successive approximation logic block 116, and sum the $2^{(K+1)}$ number of N-bit digital signals to obtain a summing result. A divider block (e.g., divider block 122 shown in FIG. 10) is configured to receive the summing result generated by the summing block and divide the summing result by 2. The divider block is configured to generate a digital signal having (N+K) bits based on the digitally controlled offset voltage having the $2^{(K+1)}$ steps.

In operation, in the $2^{(K+1)}$ steps under a charge redistribution successive approximation algorithm, the $(2^{(K+1)}-1)$ capacitors of the plurality of binary weighted capacitors including capacitors from C(N−K) to C(N−K−2+$2^{K+1}$) are arranged in a rotating manner to reduce capacitor mismatch errors (e.g., stochastic errors caused by the semiconductor fabrication technology). For example, in a first step of the $2^{(K+1)}$ steps, C(N−K) is controlled by bit<N−K−1>. C(N−K+1) and C(N−K+2) are controlled by bit<N−K>. Prior to the second step, the plurality of binary weighted capacitors including capacitors from C(N−K) to C(N−K−2+$2^{K+1}$) is rotated to the left. The first capacitor C(N−K) of the plurality of binary weighted capacitors becomes the last one of the plurality of binary weighted capacitors. As a result of this rotation, in a second step of the $2^{(K+1)}$ steps, C(N−K+1) is controlled by bit<N−K−1>. C(N−K+2) and C(N−K+3) are controlled by bit<N−K>.

After having the digitally controlled offset voltage 202, there are $2^{(K+1)}$ steps under the charge redistribution successive approximation algorithm. The number of the capacitors having the same binary weight (e.g., $2^{N-K-1}$) is $2^{(K+1)}-1$. In the last step of the $2^{(K+1)}$ steps, the $(2^{(K+1)}-1)$ capacitors of the plurality of binary weighted capacitors including capacitors from C(N−K) to C(N−K−2+$2^{K+1}$) are arranged in a predetermined manner. The detailed operating principle of the charge redistribution SAC circuit will be described below with respect to FIG. 12.

Figure 12:
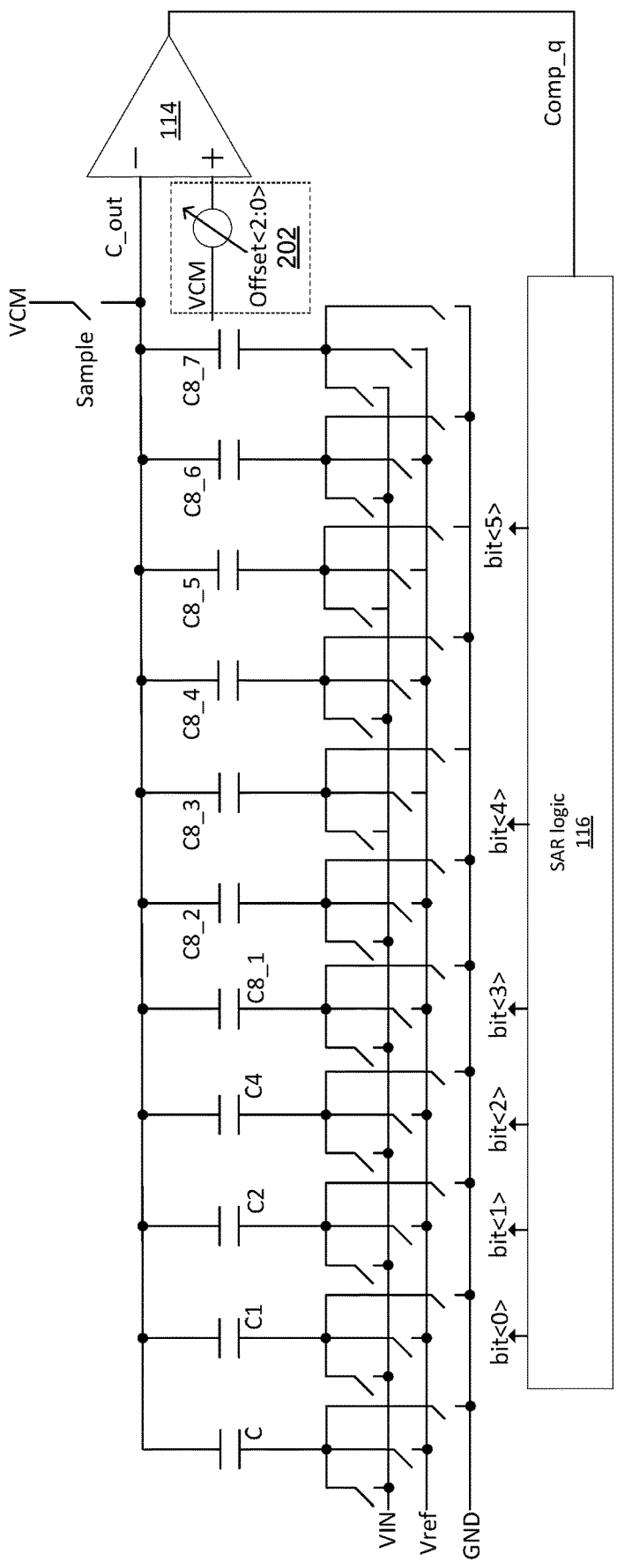
FIG. 12 illustrates a schematic diagram of the charge redistribution SAC circuit of an 8-bit ADC in accordance with various embodiments of the present disclosure.

FIG. 12 illustrates a schematic diagram of the charge redistribution SAC circuit of an 8-bit ADC in accordance with various embodiments of the present disclosure. In some embodiments, N is equal to 6 and K is equal to 2. The charge redistribution successive approximation ADC is implemented as a 6-bit ADC. By employing the digitally controlled offset voltage 202 having $2^{(K+1)}$ steps (i.e. 8 steps), the charge redistribution successive approximation ADC can be extended to a higher resolution ADC (e.g., an 8-bit ADC).

Referring back to FIG. 11, the $(2^{(K+1)}-1)$ capacitors of the plurality of binary weighted capacitors including capacitors from C(N−K) to C(N−K−2+$2^{K+1}$) are arranged in a rotating manner to reduce capacitor mismatch errors. These capacitors are controlled by control bits from bit<N−K−1> to bit<N−1>. Throughout the description, the capacitor controlled by bit<N−K−1> is alternatively referred to as a first capacitor branch. The capacitors controlled by bit<N−K> are alternatively referred to as a second capacitor branch. The capacitors controlled by bit<N−1> are alternatively referred to as a (K+1)th capacitor branch. Since capacitors from C(N−K) to C(N−K−2+2$^{K+1}$) are arranged in a rotating manner to occupy different capacitor branches, the capacitor/capacitors in each capacitor branch are not fixed.

As shown in FIG. 12, a plurality of binary weighted capacitors and a plurality of capacitor branches are coupled between a first input terminal of the comparator 114 and three signal buses VIN, Vref and GND. A first capacitor C1 has a binary weight equal to 1. A second capacitor C2 has a binary weight equal to 2. A third capacitor C4 has a binary weight equal to 4.

The plurality of capacitor branches comprises a plurality of capacitors having the same binary weight. As shown in FIG. 12, the plurality of capacitors having the same binary weight is a fourth capacitor C8_1, a fifth capacitor C8_2, a sixth capacitor C8_3, a seventh capacitor C8_4, an eighth capacitor C8_5, a ninth capacitor C8-6 and a tenth capacitor C8_7. All these seven capacitors are of a same binary weight equal to 8.

Each capacitor branch is controlled by a corresponding bit. For example, bit<4> is used to control two capacitors having a binary weight of 8. These two capacitors form a capacitor branch. Likewise, bit<5> is used to control four capacitors having a binary weight of 8. These four capacitors form another capacitor branch.

As described above with respect to FIG. 11, in a charge redistribution successive approximation algorithm, the capacitors having the same binary weight (e.g., 8) are not fixed in a particular capacitor branch. In the eight steps of the ADC process, the capacitors having the same binary weight are arranged in a rotating manner to occupy different capacitor branches.

Table 1 shows how the fourth capacitor C8_1, the fifth capacitor C8_2, the sixth capacitor C8_3, the seventh capacitor C8_4, the eighth capacitor C8_5, the ninth capacitor C8-6 and the tenth capacitor C8-7 are arranged in a rotating manner to occupy different capacitor branches.

TABLE 1

| Offset<2:0> | bit<3> | bit<4> | | bit<5> | | | |
|---|---|---|---|---|---|---|---|
| 000 | C8_1 | C8_2 | C8_3 | C8_4 | C8_5 | C8_6 | C8_7 |
| 001 | C8_2 | C8_3 | C8_4 | C8_5 | C8_6 | C8_7 | C8_1 |
| 010 | C8_3 | C8_4 | C8_5 | C8_6 | C8_7 | C8_1 | C8_2 |
| 011 | C8_4 | C8_5 | C8_6 | C8_7 | C8_1 | C8_2 | C8_3 |
| 100 | C8_5 | C8_6 | C8_7 | C8_1 | C8_2 | C8_3 | C8_4 |
| 101 | C8_6 | C8_7 | C8_1 | C8_2 | C8_3 | C8_4 | C8_5 |
| 110 | C8_7 | C8_1 | C8_2 | C8_3 | C8_4 | C8_5 | C8_6 |
| 111 | C8_7 | C8_6 | C8_5 | C8_4 | C8_3 | C8_2 | C8_1 |

As shown in Table 1, in a first step (000), the fourth capacitor C8-1 is configured as a fourth binary weighted capacitor having a binary weight of 8. The fourth binary weighted capacitor is controlled by bit<3>. A combination of the fifth capacitor C8-2 and the sixth capacitor C8-3 is configured as a fifth binary weighted capacitor having a binary weight of 16. The fifth binary weighted capacitor is controlled by bit<4>. A combination of the seventh capacitor C8_4, the eighth capacitor C8_5, the ninth capacitor C8-6 and the tenth capacitor C8-7 is configured as a sixth binary weighted capacitor having a binary weight of 32. The sixth binary weighted capacitor is controlled by bit<5>.

In a second step (001), the fifth capacitor C8-2 is configured as a fourth binary weighted capacitor having a binary weight of 8. The fourth binary weighted capacitor is controlled by bit<3>. A combination of the sixth capacitor C8-3 and the seventh capacitor C8-4 is configured as a fifth binary weighted capacitor having a binary weight of 16. The fifth binary weighted capacitor is controlled by bit<4>. A combination of the eighth capacitor C8_5, the ninth capacitor C8_6, the tenth capacitor C8-7 and the fourth capacitor C8-1 is configured as a sixth binary weighted capacitor having a binary weight of 32. The sixth binary weighted capacitor is controlled by bit<5>.

In a third step (010), the sixth capacitor C8-3 is configured as a fourth binary weighted capacitor having a binary weight of 8. The fourth binary weighted capacitor is controlled by bit<3>. A combination of the seventh capacitor C8-4 and the eighth capacitor C8-5 is configured as a fifth binary weighted capacitor having a binary weight of 16. The fifth binary weighted capacitor is controlled by bit<4>. A combination of the ninth capacitor C8_6, the tenth capacitor C8_7, the fourth capacitor C8-1 and the fifth capacitor C8-2 is configured as a sixth binary weighted capacitor having a binary weight of 32. The sixth binary weighted capacitor is controlled by bit<5>.

In a fourth step (011), the seventh capacitor C8-4 is configured as a fourth binary weighted capacitor having a binary weight of 8. The fourth binary weighted capacitor is controlled by bit<3>. A combination of the eighth capacitor C8-5 and the ninth capacitor C8-6 is configured as a fifth binary weighted capacitor having a binary weight of 16. The fifth binary weighted capacitor is controlled by bit<4>. A combination of the tenth capacitor C8_7, the fourth capacitor C8_1, the fifth capacitor C8-2 and the sixth capacitor C8-3 is configured as a sixth binary weighted capacitor having a binary weight of 32. The sixth binary weighted capacitor is controlled by bit<5>.

In a fifth step (100), the eighth capacitor C8-5 is configured as a fourth binary weighted capacitor having a binary weight of 8. The fourth binary weighted capacitor is controlled by bit<3>. A combination of the ninth capacitor C8-6 and the tenth capacitor C8-7 is configured as a fifth binary weighted capacitor having a binary weight of 16. The fifth binary weighted capacitor is controlled by bit<4>. A combination of the fourth capacitor C8_1, the fifth capacitor C8_2, the sixth capacitor C8-3 and the seventh capacitor C8-4 is configured as a sixth binary weighted capacitor having a binary weight of 32. The sixth binary weighted capacitor is controlled by bit<5>.

In a sixth step (101), the ninth capacitor C8-6 is configured as a fourth binary weighted capacitor having a binary weight of 8. The fourth binary weighted capacitor is controlled by bit<3>. A combination of the tenth capacitor C8-7 and the fourth capacitor C8-1 is configured as a fifth binary weighted capacitor having a binary weight of 16. The fifth binary weighted capacitor is controlled by bit<4>. A combination of the fifth capacitor C8_2, the sixth capacitor C8_3, the seventh capacitor C8-4 and the eighth capacitor C8-5 is configured as a sixth binary weighted capacitor having a binary weight of 32. The sixth binary weighted capacitor is controlled by bit<5>.

In a seventh step (110), the tenth capacitor C8-7 is configured as a fourth binary weighted capacitor having a binary weight of 8. The fourth binary weighted capacitor is controlled by bit<3>. A combination of the fourth capacitor C8-1 and the fifth capacitor C8-2 is configured as a fifth binary weighted capacitor having a binary weight of 16. The fifth binary weighted capacitor is controlled by bit<4>. A combination of the sixth capacitor C8_3, the seventh capacitor C8_4, the eighth capacitor C8-5 and the ninth capacitor C8-6 is configured as a sixth binary weighted capacitor having a binary weight of 32. The sixth binary weighted capacitor is controlled by bit<5>.

In an eight step (111), the tenth capacitor C8-7 is configured as a fourth binary weighted capacitor having a binary weight of 8. The fourth binary weighted capacitor is controlled by bit<3>. A combination of the ninth capacitor C8-6 and the eighth capacitor C8-5 is configured as a fifth binary weighted capacitor having a binary weight of 16. The fifth binary weighted capacitor is controlled by bit<4>. A combination of the seventh capacitor C8_4, the sixth capacitor C8_3, the fifth capacitor C8-2 and the fourth capacitor C8-1 is configured as a sixth binary weighted capacitor having a binary weight of 32. The sixth binary weighted capacitor is controlled by bit<5>.

It should be noted that in the eighth step, the arrangement of the fourth capacitor C8_1, the fifth capacitor C8_2, the sixth capacitor C8_3, the seventh capacitor C8_4, the eighth capacitor C8_5, the ninth capacitor C8-6 and the tenth capacitor C8-7 is merely an example. Depending on design needs, this arrangement may vary accordingly.

One advantageous feature of having the ADC operating principle shown in Table 1 is that the combination of different capacitors is completed in the eight steps so as to create a situation similar to the use of random capacitor arrays to resolve the random mismatch errors caused by the semiconductor fabrication process. In an 8-bit ADC without employing the ADC operating principle shown in Table 1, the mismatch error is up to 15.5 ΔC. ΔC is a fixed error in each capacitor. By employing the ADC operating principle shown in Table 1, the mismatch error can be reduced to 2×ΔC.

steps), the charge redistribution successive approximation ADC can be extended to a higher resolution ADC (e.g., a 14-bit ADC).

In some embodiments, the SAR ADC circuit comprises an MSB portion for processing upper six bits and an LSB portion for processing lower six bits. Each of the MSB portion and the LSB portion has a structure similar to that shown in FIG. 12, and hence is not discussed again herein. The major difference is on the series connected capacitor C_b, the value of which is approximately equal to (64×C/65). During the acquisition mode, all capacitors in the LSB portion is connected in parallel forming a total capacitance of 64×C. The total capacitance of LSB portion is connected in series with C_b to form a total capacitance of C between the first input terminal of the comparator 114 and Vref.

Figure 13:
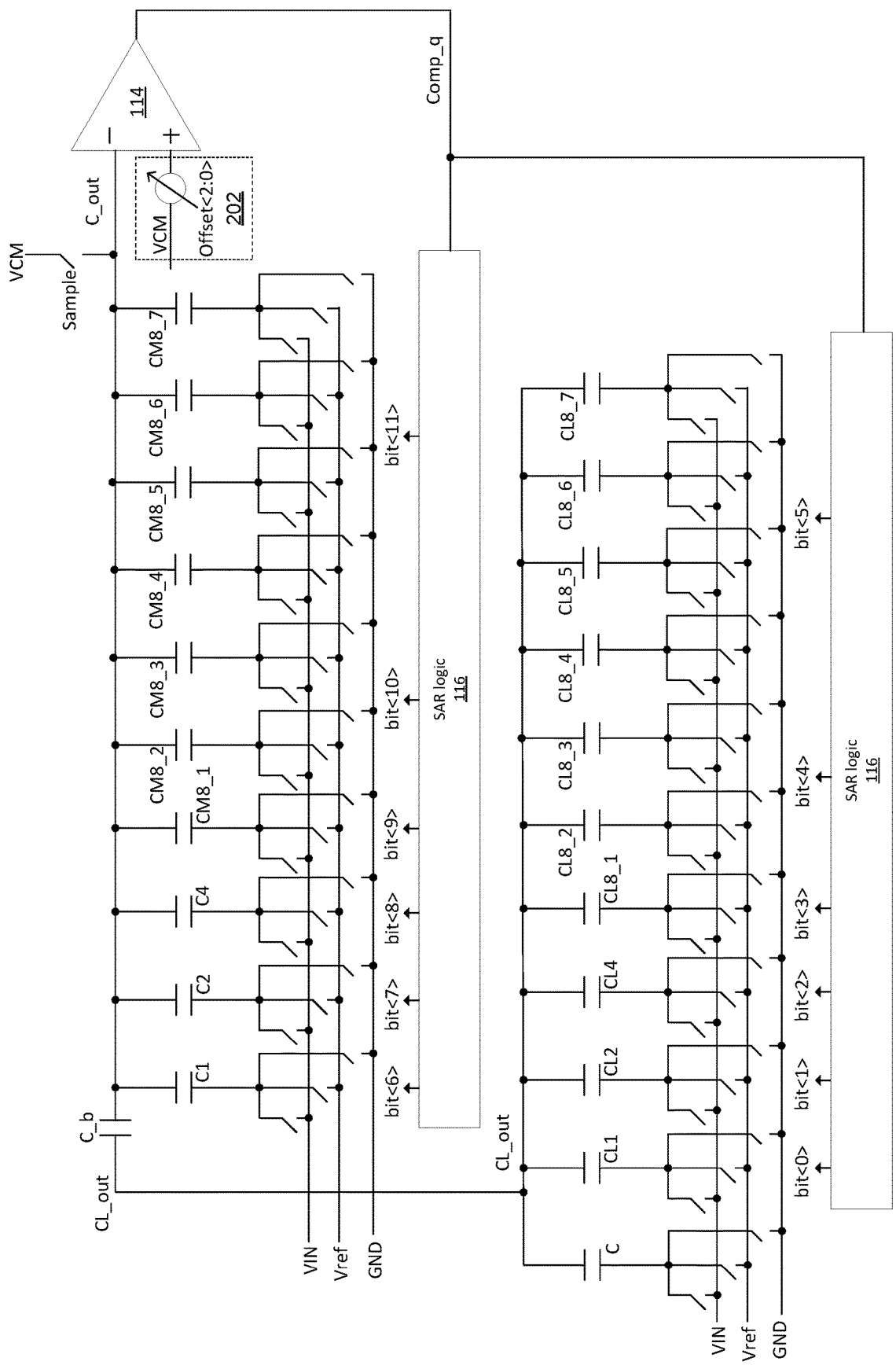
FIG. 13 illustrates a schematic diagram of the charge redistribution SAC circuit of a 14-bit ADC in accordance with various embodiments of the present disclosure.

In FIG. 13, the capacitance value of C2 and CL2 are both 2×C. The capacitance value of C4 and CL4 are both 4×C. The capacitance value of CL8 and CM8 are both 8×C.

Table 2 shows how the fourth capacitor CL8_1, the fifth capacitor CL8_2, the sixth capacitor CL8_3, the seventh capacitor CL8_4, the eighth capacitor CL8_5, the ninth capacitor CL8_6 and the tenth capacitor CL8_7 of the LSB portion are arranged in a rotating manner to occupy different capacitor branches.

TABLE 2

| Offset<2:0> | bit<3> | bit<4> | | | bit<5> | | |
|---|---|---|---|---|---|---|---|
| 000 | CL8_1 | CL8_2 | CL8_3 | CL8_4 | CL8_5 | CL8_6 | CL8_7 |
| 001 | CL8_2 | CL8_3 | CL8_4 | CL8_5 | CL8_6 | CL8_7 | CL8_1 |
| 010 | CL8_3 | CL8_4 | CL8_5 | CL8_6 | CL8_7 | CL8_1 | CL8_2 |
| 011 | CL8_4 | CL8_5 | CL8_6 | CL8_7 | CL8_1 | CL8_2 | CL8_3 |
| 100 | CL8_5 | CL8_6 | CL8_7 | CL8_1 | CL8_2 | CL8_3 | CL8_4 |
| 101 | CL8_6 | CL8_7 | CL8_1 | CL8_2 | CL8_3 | CL8_4 | CL8_5 |
| 110 | CL8_7 | CL8_1 | CL8_2 | CL8_3 | CL8_4 | CL8_5 | CL8_6 |
| 111 | CL8_7 | CL8_6 | CL8_5 | CL8_4 | CL8_3 | CL8_2 | CL8_1 |

The operating principle of the LSB portion of the 14-bit ADC shown in Table 2 is similar to that shown in Table 1, and hence is not discussed again to avoid repetition.

Table 3 shows how the fourth capacitor CM8_1, the fifth capacitor CM8_2, the sixth capacitor CM8_3, the seventh capacitor CM8_4, the eighth capacitor CM8_5, the ninth capacitor CM8_6 and the tenth capacitor CM8_7 of the MSB portion are arranged in a rotating manner to occupy different capacitor branches.

TABLE 3

| Offset<2:0> | bit<9> | bit<10> | | | bit<11> | | |
|---|---|---|---|---|---|---|---|
| 000 | CM8_1 | CM8_2 | CM8_3 | CM8_4 | CM8_5 | CM8_6 | CM8_7 |
| 001 | CM8_2 | CM8_3 | CM8_4 | CM8_5 | CM8_6 | CM8_7 | CM8_1 |
| 010 | CM8_3 | CM8_4 | CM8_5 | CM8_6 | CM8_7 | CM8_1 | CM8_2 |
| 011 | CM8_4 | CM8_5 | CM8_6 | CM8_7 | CM8_1 | CM8_2 | CM8_3 |
| 100 | CM8_5 | CM8_6 | CM8_7 | CM8_1 | CM8_2 | CM8_3 | CM8_4 |
| 101 | CM8_6 | CM8_7 | CM8_1 | CM8_2 | CM8_3 | CM8_4 | CM8_5 |
| 110 | CM8_7 | CM8_1 | CM 8_2 | CM8_3 | CM8_4 | CM8_5 | CM8_6 |
| 111 | CM8_7 | CM8_6 | CM 8_5 | CM8_4 | CM8_3 | CM8_2 | CM8_1 |

FIG. 13 illustrates a schematic diagram of the charge redistribution SAC circuit of a 14-bit ADC in accordance with various embodiments of the present disclosure. In some embodiments, N is equal to 12 and K is equal to 2. The charge redistribution successive approximation ADC is implemented as a 12-bit ADC. By employing the digitally controlled offset voltage 202 having $2^{(K+1)}$ steps (i.e. 8

The operating principle of the MSB portion shown in Table 3 is similar to that shown in Table 1, and hence is not discussed again to avoid repetition.

Figure 14:
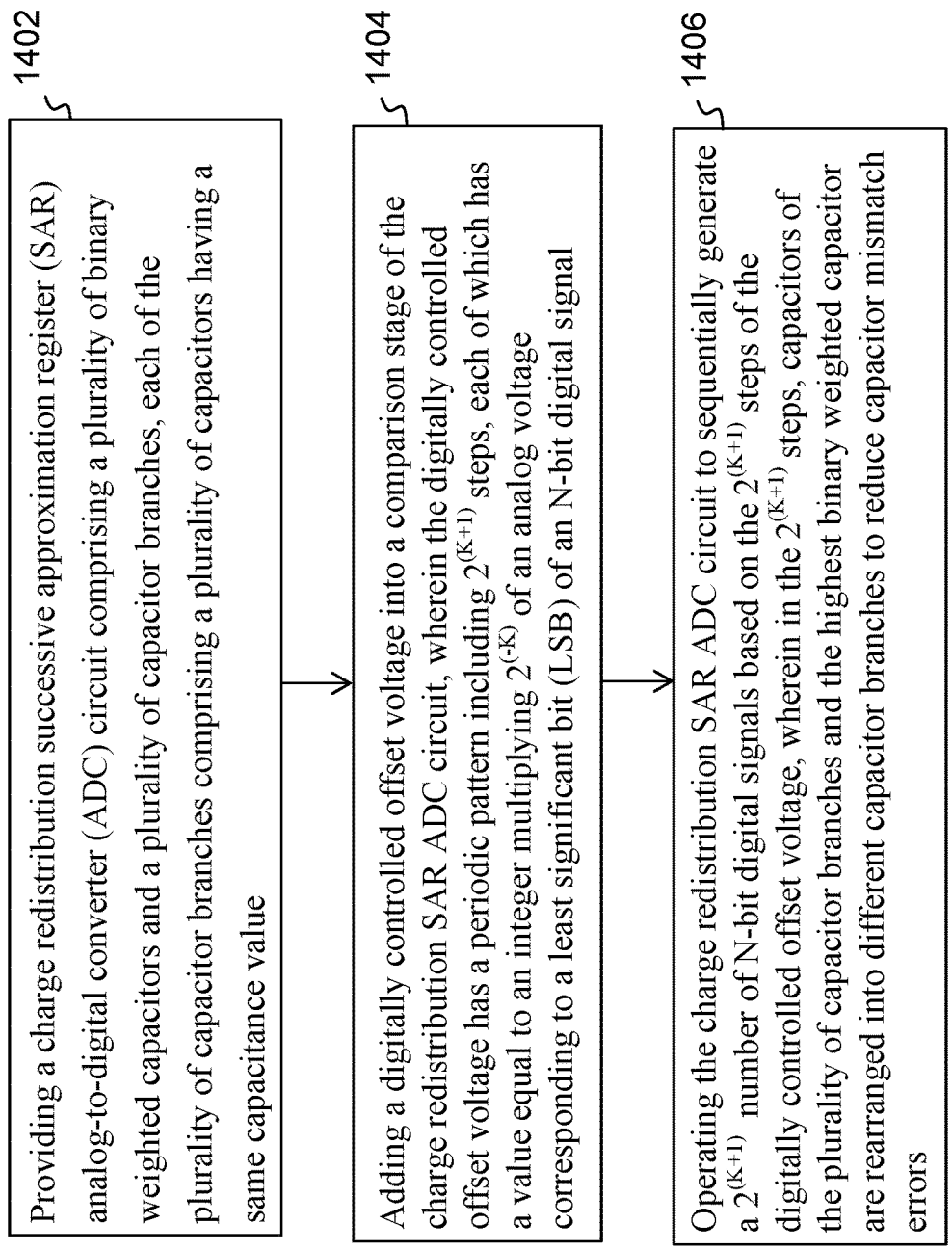
FIG. 14 illustrates a flow chart of a method for achieving a higher resolution ADC in accordance with various embodiments of the present disclosure.

FIG. 14 illustrates a flow chart of a method for achieving a higher resolution ADC in accordance with various embodiments of the present disclosure. This flowchart shown in FIG. 14 is merely an example, which should not unduly limit the scope of the claims. One of ordinary skill in the art would recognize many variations, alternatives, and modifications. For example, various steps illustrated in FIG. 14 may be added, removed, replaced, rearranged and repeated.

Referring back to FIG. 11, a plurality of binary weighted capacitors is coupled between a first input terminal of a comparator (e.g., comparator 114) and a plurality of signal buses (e.g., VIN, Vref and GND). The plurality of binary weighted capacitors has a binary weight increasing by two times from a first capacitor (e.g., C1) to a (N−K)th capacitor (e.g., C(N−K)), and a constant binary weight from the (N−K)th capacitor (e.g., C(N−K)) to an (N−K−2+2$^{(K+1)}$)th capacitor (e.g., C(N−K−2+2$^{(K+1)}$)). An offset voltage generator is configured to generate a digitally controlled offset voltage having 2$^{(K+1)}$ steps fed into a second input terminal of the comparator.

Referring back to FIG. 10, a successive approximation logic block (e.g., successive approximation logic block 116) is configured to receive an output signal of the comparator, and generate an N-bit control signal for controlling the plurality of binary weighted capacitors and a 2$^{(K+1)}$ number of N-bit digital signals based on the 2$^{(K+1)}$ steps of the digitally controlled offset voltage. A summing block (e.g., summing block 120) is configured to receive the 2$^{(K+1)}$ number of N-bit digital signals from the successive approximation logic block, and sum the 2$^{(K+1)}$ number of N-bit digital signals to obtain a summing result. A divider block (e.g., divider block 122) is configured to receive the summing result generated by the summing block, and divide the summing result by 2. The divider block is configured to generate a digital signal having (N+K) bits.

At step 1402, a charge redistribution SAR ADC circuit is provided. The SAR ADC circuit comprises a plurality of binary weighted capacitors and a plurality of capacitor branches, each of the plurality of capacitor branches comprising a plurality of capacitors having a same capacitance value.

At step 1404, a digitally controlled offset voltage is added into a comparison stage of the charge redistribution SAR ADC circuit. The digitally controlled offset voltage has a periodic pattern including 2$^{(K+1)}$ steps, each of which has a value equal to an integer multiplying 2$^{(-K)}$ of an analog voltage (ALSB) corresponding to a least significant bit (LSB) of an N-bit digital signal.

At step 1406, the charge redistribution SAR ADC circuit is configured to sequentially generate a 2$^{(K+1)}$ number of N-bit digital signals based on the 2$^{(K+1)}$ steps of the digitally controlled offset voltage. In the 2$^{(K+1)}$ steps, capacitors of the plurality of capacitor branches are rearranged into different capacitor branches to reduce capacitor mismatch errors.

The method further comprises summing the 2$^{(K+1)}$ number of N-bit digital signals to obtain a summing result, and dividing the summing result through a divider block to obtain a digital signal having (N+K) bits.

In each period of the digitally controlled offset voltage, each step appears at least once, and a sum of the steps in one period is equal to zero.

In some embodiments, N is equal to 6 and K is equal to 2. The plurality of binary weighted capacitors comprises a first capacitor having a binary weight equal to 1, a second capacitor having a binary weight equal to 2 and a third capacitor having a binary weight equal to 4. The plurality of capacitor branches comprises a fourth capacitor having a binary weight equal to 8, a fifth capacitor having a binary weight equal to 8, a sixth capacitor having a binary weight equal to 8, a seventh capacitor having a binary weight equal to 8, an eighth capacitor having a binary weight equal to 8, a ninth capacitor having a binary weight equal to 8 and a tenth capacitor having a binary weight equal to 8.

The method further comprises in a charge redistribution successive approximation algorithm, rearranging the fourth capacitor, the fifth capacitor, the sixth capacitor, the seventh capacitor, the eighth capacitor, the ninth capacitor and the tenth capacitor into the different capacitor branches in a random manner.

The method further comprises in a charge redistribution successive approximation algorithm, rearranging the fourth capacitor, the fifth capacitor, the sixth capacitor, the seventh capacitor, the eighth capacitor, the ninth capacitor and the tenth capacitor into the different capacitor branches in a rotating manner.

The method further comprises in a first step, configuring the fourth capacitor as a fourth binary weighted capacitor, a combination of the fifth capacitor and the sixth capacitor as a fifth binary weighted capacitor, and a combination of the seventh capacitor, the eighth capacitor, the ninth capacitor and the tenth capacitor as a sixth binary weighted capacitor of the charge redistribution successive approximation algorithm.

The method further comprises in a second step, configuring the fifth capacitor as the fourth binary weighted capacitor, a combination of the sixth capacitor and the seventh capacitor as the fifth binary weighted capacitor, and a combination of the eighth capacitor, the ninth capacitor, the tenth capacitor and the fourth capacitor as the sixth binary weighted capacitor of the charge redistribution successive approximation algorithm.

The method further comprises in a third step, configuring the sixth capacitor as the fourth binary weighted capacitor, a combination of the seventh capacitor and the eighth capacitor as the fifth binary weighted capacitor, and a combination of the ninth capacitor, the tenth capacitor, the fourth capacitor and the fifth capacitor as the sixth binary weighted capacitor of the charge redistribution successive approximation algorithm.

The method further comprises in a fourth step, configuring the seventh capacitor as the fourth binary weighted capacitor, a combination of the eighth capacitor and the ninth capacitor as the fifth binary weighted capacitor, and a combination of the tenth capacitor, the fourth capacitor, the fifth capacitor and the sixth capacitor as the sixth binary weighted capacitor of the charge redistribution successive approximation algorithm.

The method further comprises in a fifth step, configuring the eighth capacitor as the fourth binary weighted capacitor, a combination of the ninth capacitor and the tenth capacitor as the fifth binary weighted capacitor, and a combination of the fourth capacitor, the fifth capacitor, the sixth capacitor and the seventh capacitor as the sixth binary weighted capacitor of the charge redistribution successive approximation algorithm.

The method further comprises in a sixth step, configuring the ninth capacitor as the fourth binary weighted capacitor, a combination of the tenth capacitor and the fourth capacitor as the fifth binary weighted capacitor, and a combination of the fifth capacitor, the sixth capacitor, the seventh capacitor and the eighth capacitor as the sixth binary weighted capacitor of the charge redistribution successive approximation algorithm.

The method further comprises in a seventh step, configuring the tenth capacitor as the fourth binary weighted capacitor, a combination of the fourth capacitor and the fifth capacitor as the fifth binary weighted capacitor, and a combination of the sixth capacitor, the seventh capacitor, the eighth capacitor and the ninth capacitor as the sixth binary weighted capacitor of the charge redistribution successive approximation algorithm.

In some embodiments, N is equal to 12 and K is equal to 2. The charge redistribution SAR ADC circuit comprises an MSB portion for processing upper six bits and an LSB portion for processing lower six bits, and wherein each of the MSB portion and the LSB portion comprises the plurality of binary weighted capacitors comprising a first capacitor having a binary weight equal to 1, a second capacitor having a binary weight equal to 2 and a third capacitor having a binary weight equal to 4, and the plurality of capacitor branches comprising a fourth capacitor having a binary weight equal to 8, a fifth capacitor having a binary weight equal to 8, a sixth capacitor having a binary weight equal to 8, a seventh capacitor having a binary weight equal to 8, an eighth capacitor having a binary weight equal to 8, a ninth capacitor having a binary weight equal to 8 and a tenth capacitor having a binary weight equal to 8.

The method further comprises in a charge redistribution successive approximation algorithm, rearranging the fourth capacitor, the fifth capacitor, the sixth capacitor, the seventh capacitor, the eighth capacitor, the ninth capacitor and the tenth capacitor of the LSB portion into different capacitor branches of the LSB portion in a first rotating manner, and in the charge redistribution successive approximation algorithm, rearranging the fourth capacitor, the fifth capacitor, the sixth capacitor, the seventh capacitor, the eighth capacitor, the ninth capacitor and the tenth capacitor of the MSB portion into different capacitor branches of the MSB portion in a second rotating manner.

The comparison stage of the charge redistribution SAR ADC circuit comprises a comparator having an inverting input connected to the common terminal of the plurality of binary weighted capacitors and the plurality of capacitor branches, and a non-inverting input configured to receive the digitally controlled offset voltage.

In accordance with an embodiment, a method of converting an analog input signal to a digital output signal comprises providing a charge redistribution successive approximation register (SAR) analog-to-digital converter (ADC) circuit comprising a plurality of binary weighted capacitors and a plurality of capacitor branches, each of the plurality of capacitor branches comprising a plurality of capacitors having a same capacitance value, adding a digitally controlled offset voltage into a comparison stage of the charge redistribution SAR ADC circuit, wherein the digitally controlled offset voltage has a periodic pattern including $2^{(K+1)}$ steps, each of which has a value equal to an integer multiplying $2^{(-K)}$ of an analog voltage (ALSB) corresponding to a least significant bit (LSB) of an N-bit digital signal, and operating the charge redistribution SAR ADC circuit to sequentially generate a $2^{(K+1)}$ number of N-bit digital signals based on the $2^{(K+1)}$ steps of the digitally controlled offset voltage, wherein in the $2^{(K+1)}$ steps, capacitors of the plurality of capacitor branches and the highest binary weighted capacitor are rearranged into different capacitor branches to reduce capacitor mismatch errors.

In accordance with another embodiment, an apparatus comprises a plurality of binary weighted capacitors coupled between a first input terminal of a comparator and a plurality of signal buses, wherein the plurality of binary weighted capacitors has a binary weight increasing by two times from a first capacitor to an (N–K)th capacitor, and a constant binary weight from the (N–K)th capacitor to a (N–K–2+$2^{(K+1)}$)th capacitor, an offset voltage generator configured to generate a digitally controlled offset voltage having $2^{(K+1)}$ steps fed into a second input terminal of the comparator, and a successive approximation logic block configured to receive an output signal of the comparator, and generate an N-bit control signal for controlling the plurality of binary weighted capacitors.

In accordance with yet another embodiment, a converter comprises a plurality of binary weighted capacitors coupled between a first input terminal of a comparator and a plurality of signal buses, wherein the plurality of binary weighted capacitors has a binary weight increasing by two times from a first capacitor to an (N–K)th capacitor, and a constant binary weight from the (N–K)th capacitor to an (N–K–2+$2^{(K+1)}$)th capacitor, an offset voltage generator configured to generate a digitally controlled offset voltage having $2^{(K+1)}$ steps fed into a second input terminal of the comparator, a successive approximation logic block configured to receive an output signal of the comparator, and generate an N-bit control signal for controlling the plurality of binary weighted capacitors and a $2^{(K+1)}$ number of N-bit digital signals based on the $2^{(K+1)}$ steps of the digitally controlled offset voltage, a summing block configured to receive the $2^{(K+1)}$ number of N-bit digital signals from the successive approximation logic block, and sum the $2^{(K+1)}$ number of N-bit digital signals to obtain a summing result, and a divider block configured to receive the summing result generated by the summing block, and divide the summing result by 2, wherein the divider block is configured to generate a digital signal having (N+K) bits.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of converting an analog input signal to a digital output signal, comprising:
   providing a charge redistribution successive approximation register (SAR) analog-to-digital converter (ADC) circuit comprising a plurality of binary weighted capacitors and a plurality of capacitor branches, each of the plurality of capacitor branches comprising a plurality of capacitors having a same capacitance value;
   adding a digitally controlled offset voltage into a comparison stage of the charge redistribution SAR ADC circuit, wherein the digitally controlled offset voltage has a periodic pattern including $2^{(K+1)}$ steps, each of which has a value equal to an integer multiplying $2^{(-K)}$ of an analog voltage (ALSB) corresponding to a least significant bit (LSB) of an N-bit digital signal; and
   operating the charge redistribution SAR ADC circuit to sequentially generate a $2^{(K+1)}$ number of N-bit digital signals based on the $2^{(K+1)}$ steps of the digitally controlled offset voltage, wherein in the $2^{(K+1)}$ steps, capacitors of the plurality of capacitor branches and the highest binary weighted capacitor are rearranged into different capacitor branches to reduce capacitor mismatch errors.

2. The method of claim 1, further comprising:
summing the $2^{(K+1)}$ number of N-bit digital signals to obtain a summing result; and
dividing the summing result through a divider block to obtain a digital signal having (N+K) bits.

3. The method of claim 1, wherein:
in each period of the digitally controlled offset voltage, each step appears at least once, and a sum of the steps in one period is equal to zero.

4. The method of claim 1, wherein:
N is equal to 6 and K is equal to 2;
the plurality of binary weighted capacitors comprises a first capacitor having a binary weight equal to 1, a second capacitor having a binary weight equal to 2 and a third capacitor having a binary weight equal to 4; and
the plurality of capacitor branches comprises a fourth capacitor having a binary weight equal to 8, a fifth capacitor having a binary weight equal to 8, a sixth capacitor having a binary weight equal to 8, a seventh capacitor having a binary weight equal to 8, an eighth capacitor having a binary weight equal to 8, a ninth capacitor having a binary weight equal to 8 and a tenth capacitor having a binary weight equal to 8.

5. The method of claim 4, further comprising:
in a charge redistribution successive approximation algorithm, rearranging the fourth capacitor, the fifth capacitor, the sixth capacitor, the seventh capacitor, the eighth capacitor, the ninth capacitor and the tenth capacitor into the different capacitor branches in a random manner.

6. The method of claim 4, further comprising:
in a charge redistribution successive approximation algorithm, rearranging the fourth capacitor, the fifth capacitor, the sixth capacitor, the seventh capacitor, the eighth capacitor, the ninth capacitor and the tenth capacitor into the different capacitor branches in a rotating manner.

7. The method of claim 6, further comprising:
in a first step, configuring the fourth capacitor as a fourth binary weighted capacitor, a combination of the fifth capacitor and the sixth capacitor as a fifth binary weighted capacitor, and a combination of the seventh capacitor, the eighth capacitor, the ninth capacitor and the tenth capacitor as a sixth binary weighted capacitor of the charge redistribution successive approximation algorithm;
in a second step, configuring the fifth capacitor as the fourth binary weighted capacitor, a combination of the sixth capacitor and the seventh capacitor as the fifth binary weighted capacitor, and a combination of the eighth capacitor, the ninth capacitor, the tenth capacitor and the fourth capacitor as the sixth binary weighted capacitor of the charge redistribution successive approximation algorithm;
in a third step, configuring the sixth capacitor as the fourth binary weighted capacitor, a combination of the seventh capacitor and the eighth capacitor as the fifth binary weighted capacitor, and a combination of the ninth capacitor, the tenth capacitor, the fourth capacitor and the fifth capacitor as the sixth binary weighted capacitor of the charge redistribution successive approximation algorithm;
in a fourth step, configuring the seventh capacitor as the fourth binary weighted capacitor, a combination of the eighth capacitor and the ninth capacitor as the fifth binary weighted capacitor, and a combination of the tenth capacitor, the fourth capacitor, the fifth capacitor and the sixth capacitor as the sixth binary weighted capacitor of the charge redistribution successive approximation algorithm;
in a fifth step, configuring the eighth capacitor as the fourth binary weighted capacitor, a combination of the ninth capacitor and the tenth capacitor as the fifth binary weighted capacitor, and a combination of the fourth capacitor, the fifth capacitor, the sixth capacitor and the seventh capacitor as the sixth binary weighted capacitor of the charge redistribution successive approximation algorithm;
in a sixth step, configuring the ninth capacitor as the fourth binary weighted capacitor, a combination of the tenth capacitor and the fourth capacitor as the fifth binary weighted capacitor, and a combination of the fifth capacitor, the sixth capacitor, the seventh capacitor and the eighth capacitor as the sixth binary weighted capacitor of the charge redistribution successive approximation algorithm; and
in a seventh step, configuring the tenth capacitor as the fourth binary weighted capacitor, a combination of the fourth capacitor and the fifth capacitor as the fifth binary weighted capacitor, and a combination of the sixth capacitor, the seventh capacitor, the eighth capacitor and the ninth capacitor as the sixth binary weighted capacitor of the charge redistribution successive approximation algorithm.

8. The method of claim 1, wherein:
N is equal to 12 and K is equal to 2; and
the charge redistribution SAR ADC circuit comprises an MSB portion for processing upper six bits and an LSB portion for processing lower six bits, and wherein each of the MSB portion and the LSB portion comprises:
the plurality of binary weighted capacitors comprising a first capacitor having a binary weight equal to 1, a second capacitor having a binary weight equal to 2 and a third capacitor having a binary weight equal to 4; and
the plurality of capacitor branches comprising a fourth capacitor having a binary weight equal to 8, a fifth capacitor having a binary weight equal to 8, a sixth capacitor having a binary weight equal to 8, a seventh capacitor having a binary weight equal to 8, an eighth capacitor having a binary weight equal to 8, a ninth capacitor having a binary weight equal to 8 and a tenth capacitor having a binary weight equal to 8.

9. The method of claim 8, further comprising:
in a charge redistribution successive approximation algorithm, rearranging the fourth capacitor, the fifth capacitor, the sixth capacitor, the seventh capacitor, the eighth capacitor, the ninth capacitor and the tenth capacitor of the LSB portion into different capacitor branches of the LSB portion in a first rotating manner; and
in the charge redistribution successive approximation algorithm, rearranging the fourth capacitor, the fifth capacitor, the sixth capacitor, the seventh capacitor, the eighth capacitor, the ninth capacitor and the tenth capacitor of the MSB portion into different capacitor branches of the MSB portion in a second rotating manner.

10. The method of claim 1, wherein:
the comparison stage of the SAR ADC circuit comprises a comparator having an inverting input connected to a common node of the plurality of binary weighted capacitors and the plurality of capacitor branches, and a non-inverting input configured to receive the digitally controlled offset voltage.

11. An apparatus comprising:
a plurality of binary weighted capacitors coupled between a first input terminal of a comparator and a plurality of signal buses, wherein the plurality of binary weighted capacitors has a binary weight increasing by two times from a first capacitor to an (N−K)th capacitor, and a constant binary weight from the (N−K)th capacitor to a (N−K−2+$2^{(K+1)}$)th capacitor;
an offset voltage generator configured to generate a digitally controlled offset voltage having $2^{(K+1)}$ steps fed into a second input terminal of the comparator; and
a successive approximation logic block configured to receive an output signal of the comparator, and generate an N-bit control signal for controlling the plurality of binary weighted capacitors.

12. The apparatus of claim 11, wherein:
the digitally controlled offset voltage has a periodic pattern including $2^{(K+1)}$ steps, and wherein in each period of the digitally controlled offset voltage, each step appears at least once, and a sum of the steps in one period is equal to zero; and
the successive approximation logic block is configured to generate a $2^{(K+1)}$ number of N-bit digital signals based on the $2^{(K+1)}$ steps of the digitally controlled offset voltage.

13. The apparatus of claim 12, further comprising:
a summing block configured to receive the $2^{(K+1)}$ number of N-bit digital signals generated by the successive approximation logic block, and sum the $2^{(K+1)}$ number of N-bit digital signals to obtain a summing result; and
a divider block configured to receive the summing result generated by the summing block, and divide the summing result by 2, and wherein the divider block is configured to generate a digital signal having (N+K) bits based on the digitally controlled offset voltage having the $2^{(K+1)}$ steps.

14. The apparatus of claim 11, wherein:
the plurality of signal buses comprises an input signal bus, a reference voltage bus and a ground bus, wherein:
in a sample phase, free terminals of the plurality of binary weighted capacitors are connected to the input signal bus;
in a hold phase, the free terminals of the plurality of binary weighted capacitors are connected to the ground bus; and
in a charge redistribution phase, the free terminals of the plurality of binary weighted capacitors are connected to the reference voltage bus or the ground bus according to logic states of the N-bit control signal.

15. The apparatus of claim 11, wherein:
($2^{(K+1)}$−1) capacitors of the plurality of binary weighted capacitors are of a capacitance value equal to that of the (N−K)th capacitor of the plurality of binary weighted capacitors.

16. The apparatus of claim 15, wherein:
in the $2^{(K+1)}$ steps under a charge redistribution successive approximation algorithm, the ($2^{(K+1)}$−1) capacitors of the plurality of binary weighted capacitors are arranged in a rotating manner to reduce capacitor mismatch errors.

17. The apparatus of claim 11, wherein:
the apparatus is a charge redistribution successive approximation register analog-to-digital converter; and
the charge redistribution successive approximation register analog-to-digital converter comprises an MSB portion for processing upper bits and an LSB portion for processing lower bits, and wherein each of the MSB portion and the LSB portion comprises a plurality of binary weighted capacitors having a binary weight increasing by two times from the first capacitor to the (N−K)th capacitor, and a constant binary weight from the (N−K)th capacitor to the (N−K−2+$2^{(K+1)}$)th capacitor.

18. A converter comprising:
a plurality of binary weighted capacitors coupled between a first input terminal of a comparator and a plurality of signal buses, wherein the plurality of binary weighted capacitors has a binary weight increasing by two times from a first capacitor to an (N−K)th capacitor, and a constant binary weight from the (N−K)th capacitor to an (N−K−2+$2^{(K+1)}$)th capacitor;
an offset voltage generator configured to generate a digitally controlled offset voltage having $2^{(K+1)}$ steps fed into a second input terminal of the comparator;
a successive approximation logic block configured to receive an output signal of the comparator, and generate an N-bit control signal for controlling the plurality of binary weighted capacitors and a $2^{(K+1)}$ number of N-bit digital signals based on the $2^{(K+1)}$ steps of the digitally controlled offset voltage;
a summing block configured to receive the $2^{(K+1)}$ number of N-bit digital signals from the successive approximation logic block, and sum the $2^{(K+1)}$ number of N-bit digital signals to obtain a summing result; and
a divider block configured to receive the summing result generated by the summing block, and divide the summing result by 2, wherein the divider block is configured to generate a digital signal having (N+K) bits.

19. The converter of claim 18, wherein:
in the $2^{(K+1)}$ steps, ($2^{(K+1)}$−1) capacitors of the plurality of binary weighted capacitors having the constant binary weight are arranged in a rotating manner to reduce capacitor mismatch errors.

20. The converter of claim 18, wherein:
the first input terminal of the comparator is an inverting terminal;
the second input terminal of the comparator is a non-inverting terminal; and
the plurality of signal buses comprises an input signal bus, a reference voltage bus and a ground bus, wherein:
in a sample phase, free terminals of the plurality of binary weighted capacitors are connected to the input signal bus;
in a hold phase, the free terminals of the plurality of binary weighted capacitors are connected to the ground bus; and
in a charge redistribution phase, the free terminals of the plurality of binary weighted capacitors are connected to the reference voltage bus or the ground bus according to logic states of the N-bit control signal.

* * * * *